US012183389B2

(12) United States Patent
Sato et al.

(10) Patent No.: US 12,183,389 B2
(45) Date of Patent: Dec. 31, 2024

(54) NAND FLASH PROGRAMMING AND METHOD OF APPLYING READ PULSE BEFORE END OF PROGRAM

(71) Applicant: Kioxia Corporation, Tokyo (JP)

(72) Inventors: Manabu Sato, Chigasaki (JP); Yoshikazu Harada, Kawasaki (JP); Naoya Shimmyo, Yokohama (JP)

(73) Assignee: Kioxia Corporation, Tokyo (JP)

( * ) Notice: Subject to any disclaimer, the term of this patent is extended or adjusted under 35 U.S.C. 154(b) by 157 days.

(21) Appl. No.: 17/806,630

(22) Filed: Jun. 13, 2022

(65) Prior Publication Data

US 2023/0092551 A1    Mar. 23, 2023

(30) Foreign Application Priority Data

Sep. 21, 2021 (JP) .................................. 2021-153545
Feb. 4, 2022 (JP) .................................. 2022-016615

(51) Int. Cl.
| | | |
|---|---|---|
| *G11C 16/08* | (2006.01) | |
| *G11C 11/4074* | (2006.01) | |
| *G11C 11/408* | (2006.01) | |
| *G11C 11/4091* | (2006.01) | |
| *G11C 11/4094* | (2006.01) | |

(Continued)

(52) U.S. Cl.
CPC ...... *G11C 11/4096* (2013.01); *G11C 11/4074* (2013.01); *G11C 11/4085* (2013.01); *G11C 11/4091* (2013.01); *G11C 11/4094* (2013.01); *G11C 11/5628* (2013.01); *G11C 11/5642* (2013.01); *G11C 16/0483* (2013.01); *G11C 16/08* (2013.01); *G11C 16/10* (2013.01); *G11C 16/26* (2013.01); *G11C 16/3418* (2013.01); *G11C 16/3436* (2013.01); *G11C 16/3459* (2013.01); *G11C 16/32* (2013.01)

(58) Field of Classification Search
CPC . G11C 11/5628; G11C 16/24; G11C 16/0483; G11C 16/26; G11C 16/30; G11C 16/32; G11C 16/08; G11C 11/5642; G11C 16/3418; G11C 16/10
See application file for complete search history.

(56) References Cited

U.S. PATENT DOCUMENTS

| | | |
|---|---|---|
| 10,748,631 B2 | 8/2020 | Tsubouchi |
| 2019/0088342 A1* | 3/2019 | Shimura ................ G11C 16/16 |

(Continued)

FOREIGN PATENT DOCUMENTS

| | | |
|---|---|---|
| JP | 2019-117679 A | 7/2019 |
| JP | 2021-44032 A | 3/2021 |

*Primary Examiner* — Mushfique Siddique
(74) *Attorney, Agent, or Firm* — Oblon, McClelland, Maier & Neustadt, L.L.P.

(57) ABSTRACT

A semiconductor storage device of an embodiment includes: a plurality of memory strings each including a plurality of memory cell transistors, the plurality of memory strings being connected in parallel to one another; and a control circuit configured to control a write operation on at least part of the plurality of memory cell transistors. The write operation is executed in response to reception of the write command and the address. The control circuit determines, based on the address, whether to perform a first voltage application operation before the write operation ends. The first voltage application operation applies a predetermined voltage to the plurality of word lines.

17 Claims, 34 Drawing Sheets

(51) Int. Cl.
  *G11C 11/4096* (2006.01)
  *G11C 11/56* (2006.01)
  *G11C 16/04* (2006.01)
  *G11C 16/10* (2006.01)
  *G11C 16/26* (2006.01)
  *G11C 16/34* (2006.01)
  G11C 16/32 (2006.01)

(56) References Cited

U.S. PATENT DOCUMENTS

| | | | |
|---|---|---|---|
| 2019/0115070 A1* | 4/2019 | Harada | G11C 11/5628 |
| 2019/0198126 A1* | 6/2019 | Tsubouchi | H10B 41/27 |
| 2020/0013468 A1* | 1/2020 | Yoshida | G11C 16/10 |
| 2020/0211655 A1* | 7/2020 | Shibata | H10B 41/27 |
| 2021/0074359 A1* | 3/2021 | Kikuchi | G11C 16/08 |
| 2023/0021244 A1* | 1/2023 | Harada | G11C 11/5628 |
| 2023/0092551 A1* | 3/2023 | Sato | G11C 11/4096 |
| | | | 365/189.011 |

* cited by examiner

PRIOR ART

PRIOR ART

PRIOR ART

PRIOR ART

PRIOR ART

PRIOR ART

FIG. 20

| CYCLE | DQ7 | DQ6 | DQ5 | DQ4 | DQ3 | DQ2 | DQ1 | DQ0 |
|---|---|---|---|---|---|---|---|---|
| 1 | A7 | A6 | A5 | A4 | A3 | A2 | A1 | A0 |
| | COLUMN ADDRESS | | | | | | | |
| 2 | A15 | A14 | A13 | A12 | A11 | A10 | A9 | A8 |
| | Don't Care | | | COLUMN ADDRESS | | | | |
| 3 | A23 | A22 | A21 | A20 | A19 | A18 | A17 | A16 |
| | BLOCK ADDRESS | | WORD LINE ADDRESS | | | | STRING UNIT ADDRESS | |
| 4 | A31 | A30 | A29 | A28 | A27 | A26 | A25 | A24 |
| | BLOCK ADDRESS | | | | PLANE ADDRESS | | | WORD LINE ADDRESS |
| 5 | A39 | A38 | A37 | A36 | A35 | A34 | A33 | A32 |
| | CHIP ADDRESS | BLOCK ADDRESS | | | | | | |
| 6 | A47 | A46 | A45 | A44 | A43 | A42 | A41 | A40 |
| | Don't Care | | | | | | CHIP ADDRESS | |

NAND FLASH PROGRAMMING AND METHOD OF APPLYING READ PULSE BEFORE END OF PROGRAM

CROSS-REFERENCE TO RELATED APPLICATIONS

This application is based upon and claims the benefit of priority from the prior Japanese Patent Application No. 2021-153545 filed in Japan on Sep. 21, 2021 and Japanese Patent Application No. 2022-016615 filed in Japan on Feb. 4, 2022; the entire contents of each of which are incorporated herein by their reference.

FIELD

Embodiments described herein relate generally to a semiconductor storage device.

BACKGROUND

A NAND memory is known as a kind of a semiconductor storage device. It is requested for such a semiconductor storage device to shorten a time period tPROG taken for data writing.

BRIEF DESCRIPTION OF THE DRAWINGS

FIG. 20 is a diagram for description of an address received at S2 in FIG. 19;

DETAILED DESCRIPTION

A semiconductor storage device of an embodiment is a semiconductor storage device configured to receive a write command and an address and perform data writing and includes: a plurality of memory strings each including a plurality of memory cell transistors connected in series, the plurality of memory strings being connected in parallel to one another; a plurality of word lines connected to gates of the plurality of memory cell transistors; a block including the plurality of memory strings connected to the plurality of word lines in common; and a control circuit configured to control a write operation on at least part of the plurality of memory cell transistors. The write operation is executed in response to reception of the write command and the address. The control circuit determines, based on the address, whether to perform a first voltage application operation before the write operation ends. The first voltage application operation applies a predetermined voltage to the plurality of word lines.

Embodiments of the present invention will be described below in detail with reference to the accompanying drawings.

First Embodiment

The present embodiment reduces a writing time period tPROG by omitting reading voltage application operation (hereinafter referred to as all-string read operation) with an all-string read pulse to be described later when writing is performed by applying a program voltage to some of word lines WL to which the program voltage is sequentially applied at writing.
(Configuration of Memory System)

Figure 1:
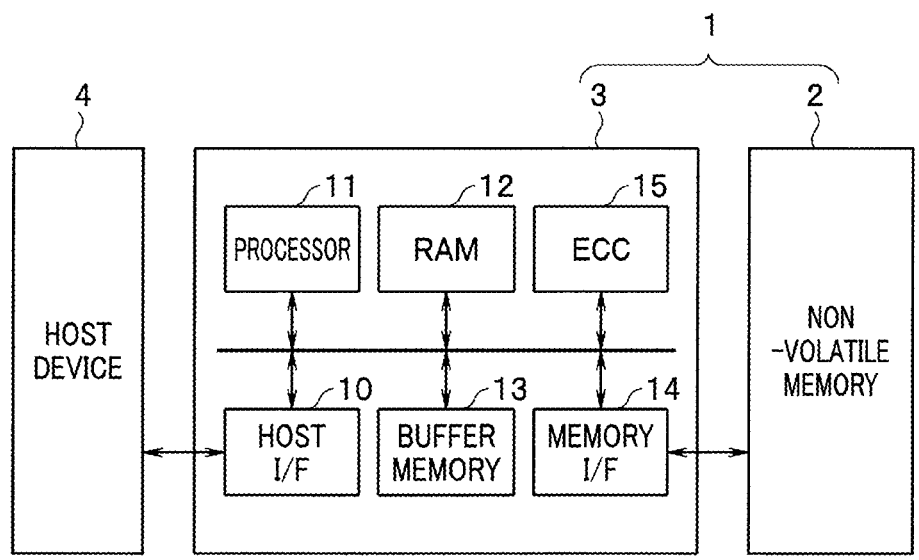
FIG. 1 is a block diagram illustrating an exemplary configuration of a memory system.

FIG. 1 is a block diagram illustrating an exemplary configuration of a memory system. A memory system 1 of the present embodiment includes a memory controller 3 and a non-volatile memory 2. Note that the non-volatile memory 2 includes a plurality of memory chips in some cases. The memory system 1 is connectable to a host device 4. The host device 4 is an electronic device such as a personal computer or a portable terminal.

The memory system 1 may have a configuration in which a plurality of chips included in the memory system 1 are mounted on a motherboard on which the host device 4 is mounted or may be configured as a system LSI (large-scale integrated circuit) or SoC (system-on-a-chip) in which the memory system 1 is implemented as one module. Examples of the memory system 1 include a memory card such as an SD card, a solid-state drive (SSD), and an embedded multimedia card (eMMC).

The non-volatile memory 2 is an NAND memory including a plurality of memory cells and non-volatilely stores data. A specific configuration of the non-volatile memory 2 will be described later.

The memory controller 3 commands writing (also referred to as programming), reading, erasure, or the like at the non-volatile memory 2 in response to, for example, a command from the host device 4. The memory controller 3 manages a memory space in the non-volatile memory 2. The memory controller 3 includes a host interface (host I/F) circuit 10, a processor 11, a random access memory (RAM) 12, a buffer memory 13, a memory interface circuit (memory I/F) circuit 14, and an error checking and correcting (ECC) circuit 15.

The host I/F circuit 10 is connected to the host device 4 through a host bus and performs interface processing with the host device 4. The host I/F circuit 10 transmits and receives a command, an address and data to and from the host device 4.

The processor 11 is configured of, for example, a central processing unit (CPU). The processor 11 controls operation of the entire memory controller 3. For example, when having received a write command from the host device 4, the processor 11 issues, to the non-volatile memory 2 through the memory I/F circuit 14, a write command in accordance with the write command from the host device 4. This is same in cases of reading and erasure. The processor 11 executes various processing, such as wear leveling, for managing the non-volatile memory 2.

The RAM 12 is used as a work area for the processor 11 and stores firmware data loaded from the non-volatile memory 2, various tables produced by the processor 11, and the like. The RAM 12 is configured of, for example, a DRAM or an SRAM.

The buffer memory 13 temporarily stores data transmitted from the host device 4 and temporarily stores data transmitted from the non-volatile memory 2.

The memory I/F circuit 14 is connected to the non-volatile memory 2 through a bus and performs interface processing with the non-volatile memory 2. The memory I/F circuit 14 transmits and receives a command, an address and data with the non-volatile memory 2.

At data writing, the ECC circuit 15 generates an error correction code for writing data and transfers the error correction code appended to the writing data to the memory I/F circuit 14. At data reading, the ECC circuit 15 performs, on reading data, error detection and/or error correction by using an error correction code included in the reading data. Note that the ECC circuit 15 may be provided in the memory I/F circuit 14.
(Configuration of Non-Volatile Memory)

Figure 2:
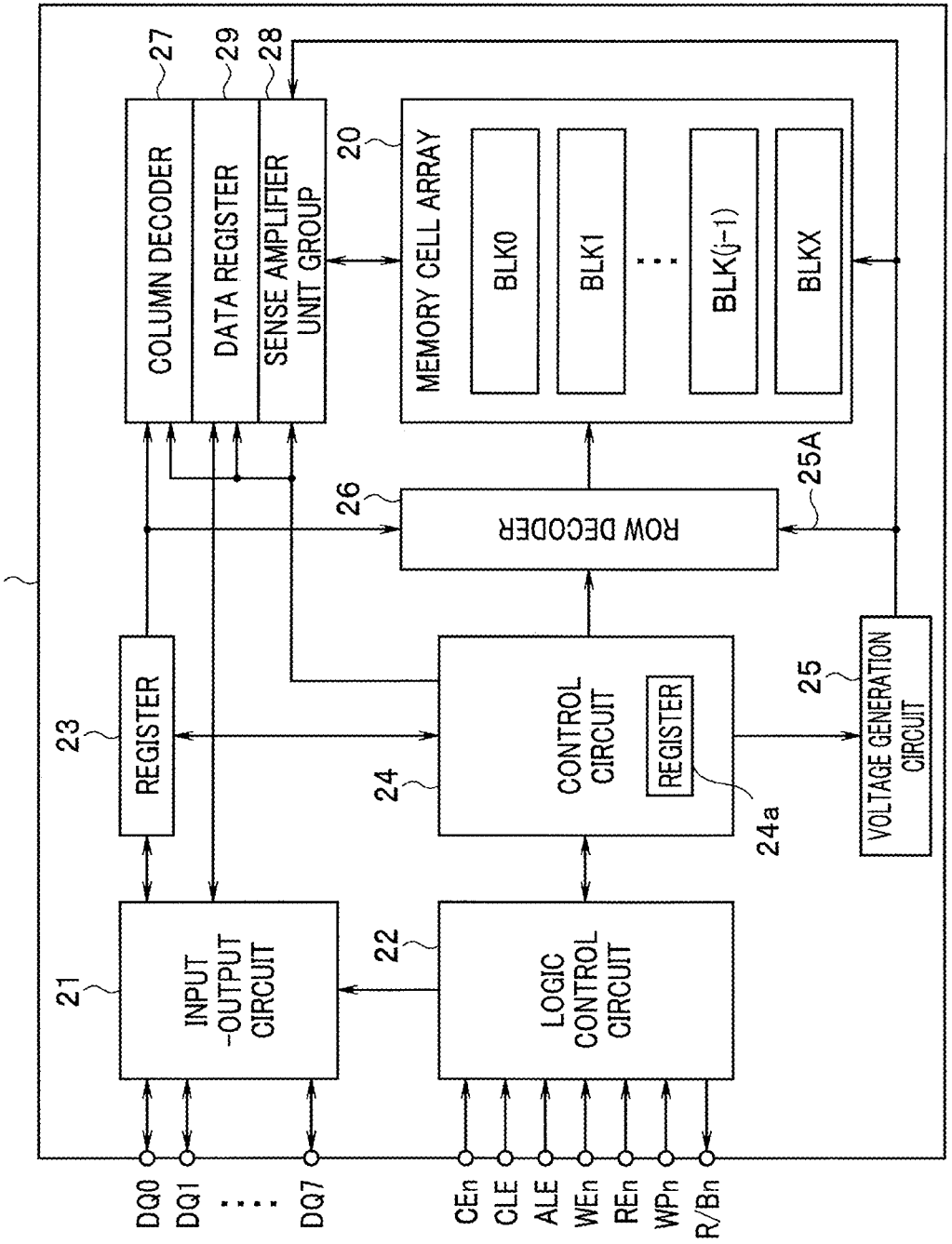
FIG. 2 is a block diagram illustrating an example of a non-volatile memory 2 in FIG. 1.

FIG. 2 is a block diagram illustrating an example of the non-volatile memory 2 in FIG. 1. The non-volatile memory 2 includes a memory cell array 20, an input-output circuit 21, a logic control circuit 22, a register 23, a control circuit 24, a voltage generation circuit 25, a row decoder 26, a column decoder 27, a sense amplifier unit group 28, and a data register (data cache) 29.

The memory cell array 20 includes j blocks BLK0 to BLK(j−1) and a block BLKX. The number j is an integer equal to or larger than one. The plurality of blocks BLK each include a plurality of memory cell transistors. The memory cell transistors configure an electrically rewritable memory cell. For example, a plurality of bit lines BL, a plurality of word lines WL, and a source line CELSRC are disposed in the memory cell array 20 to control voltages applied to the memory cell transistors. A specific configuration of each block BLK will be described later.

The input-output circuit 21 and the logic control circuit 22 are connected to the memory controller 3 through a bus. The input-output circuit 21 transmits and receives signals DQ (for example, DQ0 to DQ7) to and from the memory controller 3 through the bus.

The logic control circuit 22 receives external control signals (for example, a chip enable signal CEn, a command latch enable signal CLE, an address latch enable signal ALE, a writing enable signal WEn, a reading enable signal REn, and a writing protection signal WPn) from the memory controller 3 through the bus. The character n added in a signal name indicates active low. The logic control circuit 22 transmits a ready/busy signal R/Bn to the memory controller 3 through the bus.

The signal CEn is a signal for selecting and enabling a particular non-volatile memory 2 in a system configuration in which a plurality of non-volatile memories 2 are used. The signal CLE enables a command transmitted as a signal DQ to be latched at the register 23. The signal ALE enables an address transmitted as a signal DQ to be latched at the register 23. The signal WEn enables writing. The signal REn enables reading. The signal WPn prohibits writing and erasure. When a basic operation command is used, the signal R/Bn indicates whether the non-volatile memory 2 is in a ready state in which writing, reading, and erasure operations are not performed (state in which a command from outside can be received) or is in a busy state (state in which a command from outside cannot be received).

When a cache program command (15 h) to be described later (and a cache read command, which is not related to the present invention) is used, the ready state is returned ahead when a data latch circuit XDL to be described later is released. Description below assumes R/Bn operation in basic operation unless cache program operation is specified, in particular. The memory controller 3 can know the state of the non-volatile memory 2 by receiving the signal R/Bn.

The register 23 includes a command register, an address register, and a status register. The command register temporarily stores a command. The address register temporarily stores an address. The status register temporarily stores data necessary for operation of the non-volatile memory 2. The register 23 is configured of, for example, an SRAM.

The control circuit 24 receives a command from the register 23 and collectively controls the non-volatile memory 2 in accordance with a sequence based on the command.

The voltage generation circuit 25 receives a power voltage from outside of the non-volatile memory 2 and generates, by using the power voltage, a plurality of voltages necessary for write operation, read operation, and erasure operation. The voltage generation circuit 25 supplies the plurality of generated voltages to the memory cell array 20, the row decoder 26, the sense amplifier unit group 28, and the like. For example, the voltage generation circuit 25 supplies various voltages to the row decoder 26 through a wire group 25A.

The row decoder 26 receives a row address from the register 23 and decodes the row address. The row decoder 26 performs word line selection operation based on the decoded row address. Note that a word line connected to a memory cell transistor MT as a writing or reading target is referred to as a select word line. The row decoder 26 forwards, to a selected block BLK, a plurality of voltages necessary for write operation, read operation, and erasure operation.

The column decoder 27 receives a column address from the register 23 and decodes the column address. The column decoder 27 supplies a predetermined voltage to each bit line BL based on the decoded column address.

At data reading, the sense amplifier unit group 28 senses and amplifies data read from a memory cell transistor onto a bit line. At data writing, the sense amplifier unit group 28 supplies writing data to a bit line BL.

At data reading, the data register 29 temporarily stores data forwarded from the sense amplifier unit group 28 and forwards the data to the input-output circuit 21 in serial. At data writing, the data register 29 temporarily stores data forwarded in serial from the input-output circuit 21 and forwards the data to the sense amplifier unit group 28. The data register 29 is configured of, for example, an SRAM.

(Block Configuration of Memory Cell Array)

Figure 3:
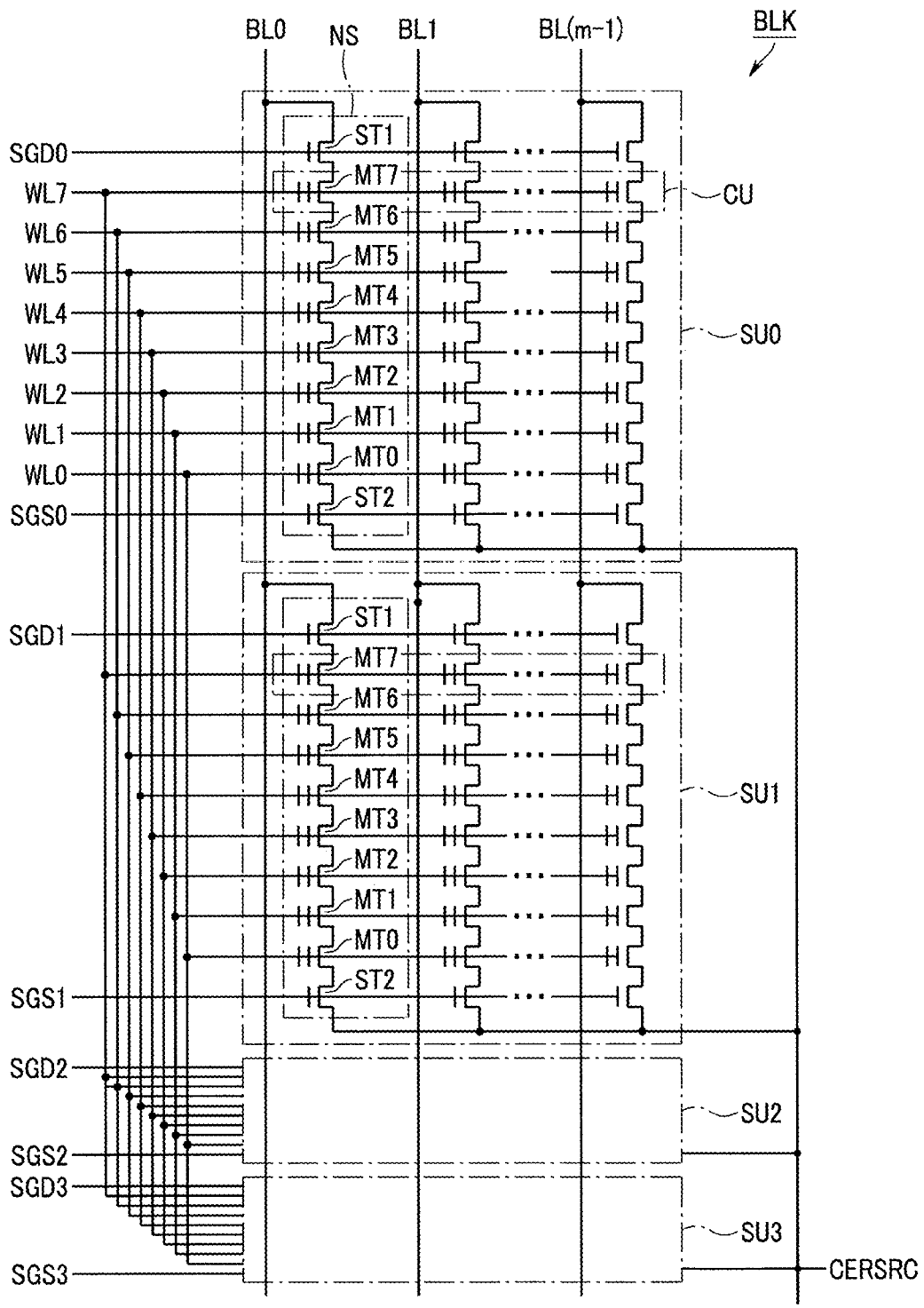
FIG. 3 is a diagram illustrating an exemplary configuration of a block of a memory cell array 20 having a three-dimensional structure.

FIG. 3 is a diagram illustrating an exemplary configuration of a block of the memory cell array 20 having a three-dimensional structure. FIG. 3 illustrates one block BLK among a plurality of blocks included in the memory cell array 20. Any other block of the memory cell array has a configuration same as the block configuration in FIG. 3.

As illustrated, the block BLK includes, for example, four string units SU0 to SU3 (hereinafter collectively referred to as string units SU). Each string unit SU includes a NAND string NS including a plurality of memory cell transistors MT MT0 to MT7) and select gate transistors ST1 and ST2. Note that the number of memory cell transistors MT included in the NAND string NS is eight in FIG. 3 but may be larger. The select gate transistors ST1 and ST2 are each illustrated as one transistor in an electric circuit but may be integrated with a memory cell transistor in a structure. The select gate transistors ST1 and ST2 may be each a plurality of select gate transistors. In addition, a dummy cell transistor may be provided between the memory cell transistors MT and each of the select gate transistors ST1 and ST2.

The memory cell transistors MT are connected in series and disposed between the select gate transistors ST1 and ST2. The memory cell transistor MT7 on one end side (bit line side) is connected to the select gate transistor ST1, and the memory cell transistor MT0 on the other end side (source line side) is connected to the select gate transistor ST2.

Gates of the select gate transistors ST1 of the respective string units SU0 to SU3 are connected to select gate lines SGD0 to SGD3 (hereinafter collectively referred to as select gate lines SGD), respectively. Gates of the select gate transistors ST2 of the respective string units SU0 to SU3 are connected to select gate lines SGS0 to SGS3 (hereinafter collectively referred to as select gate lines SGS), respectively. Note that the gates of the plurality of select gate transistor ST2 in each block BLK may be connected to a common select gate line SGS.

Gates of the memory cell transistors MT0 to MT7 in the same block BLK are connected to word lines WL0 to WL7, respectively, in common. Specifically, the word lines WL0 to WL7 are connected in common among the plurality of string units SU0 to SU3 in the same block BLK, but the select gate lines SGD are independent among the string units SU0 to SU3 even in the same block BLK. The gates of memory cell transistors MTi on the same row in each block BLK are connected to the same word line WLi.

Each NAND string NS is connected to a corresponding bit line. Accordingly, each memory cell transistor MT is connected to the bit line through the select gate transistors ST1 and ST2 included in the NAND string NS and the other memory cell transistors MT. Typically, data of the memory cell transistors MT in the same block BLK is erased all at once. However, data reading and writing are typically performed all at once on a plurality of memory cell transistors MT connected in common to one word line WL disposed in one string unit SU. Such a set of memory cell transistors MT that share one word line WL in one string unit SU is referred to as a cell unit CU.

Write operation on the cell unit CU is executed in units of pages. For example, when each cell is a triple level cell (TLC) that can store three bits (eight values) of data, one cell unit CU can store three pages of data. Three bits that can be stored in each memory cell transistor MT correspond to the three pages, respectively.

(Stack Structure of Block BLK)

Figure 4:
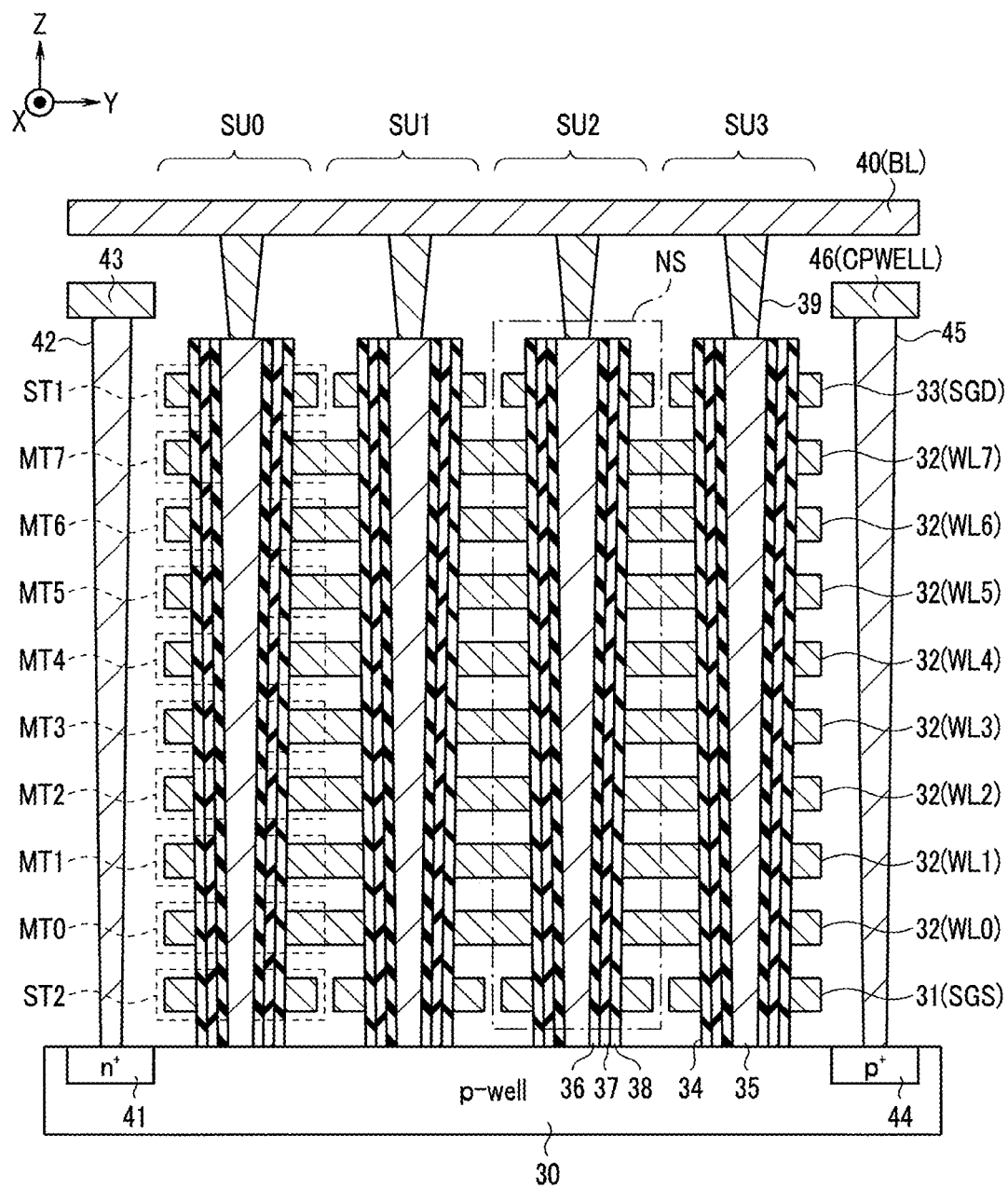
FIG. 4 is a cross-sectional view of a partial region of a block BLK.

FIG. 4 is a cross-sectional view of a partial region of each block BLK. An X direction is a direction in which the select gate lines SGD extend, a Y direction intersecting the X direction on a horizontal plane is a direction in which the bit lines extend, and a Z direction is a stack direction.

A plurality of NAND strings NS are provided on a p-type well region (p-well) 30. Specifically, a wiring layer 31 that functions as the select gate lines SGS, eight wiring layers 32 that function as the word lines WL0 to WL7, and a wiring layer 33 that functions as the select gate lines SGD are sequentially stacked on the well region 30. A non-illustrated insulating layer is provided between the stacked wiring layers.

A memory hole 34 penetrates through the wiring layers 31, 32, and 33 to the well region 30. A semiconductor layer (semiconductor pillar) 35 having a pillar shape is provided in the memory hole 34. Note that the semiconductor layer 35 may have a cylindrical shape and may be provided to surround a non-illustrated insulator. A gate insulating film 36, an electric charge accumulation layer (insulating film) 37, and a block insulating film 38 are sequentially provided on a side surface of the semiconductor layer 35. These form memory cell transistors MT and select gate transistors ST1 and ST2. The semiconductor layer 35 functions as a current path of a NAND string NS and is a region in which a channel of each transistor is formed. An upper end of the semiconductor layer 35 is connected through a contact plug 39 to a metal wiring layer 40 that functions as a bit line BL.

Accordingly, a channel region that is configured by the channels of the plurality of memory cell transistors MT included in each NAND string NS and functions as the current path of the NAND string NS is formed between the select gate transistors ST1 and ST2 of the NAND string NS. Each channel region is connected to one of the plurality of bit lines BL through the select gate transistor ST1 and is connected to the well region 30 as a substrate through the select gate transistor ST2. Each channel region is provided above the substrate and has a pillar shape.

An n+ diffusion layer 41 into which n-type impurities at high concentration are introduced is provided in a surface region of the well region 30. A contact plug 42 is provided on the diffusion layer 41 and connected to a metal wiring layer 43 that functions as a source line. In addition, a p+ diffusion layer 44 into which p-type impurities at high concentration are introduced is provided in the surface region of the well region 30. A contact plug 45 is provided on the diffusion layer 44 and connected to a metal wiring layer 46 that functions as a well wire CPWELL. The well wire CPWELL is a wire for applying a voltage to the semiconductor layer 35 through the well region 30.

A plurality of above-described configurations are arrayed in a depth direction (X direction) with respect to the sheet of FIG. 4, and a string unit SU is configured by a set of a plurality of NAND strings NS arranged in the depth direction.

(Threshold Value Distribution and Coding)

Figure 5:
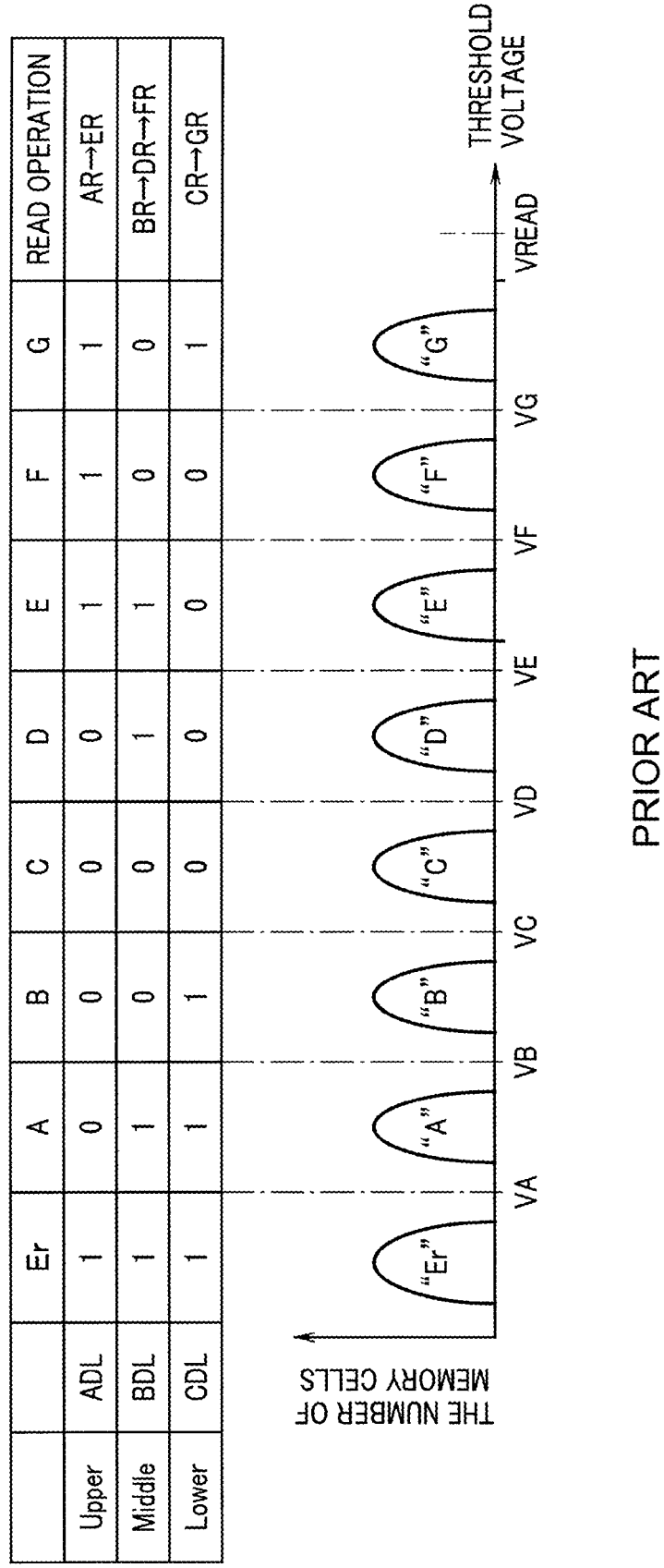
FIG. 5 is an explanatory diagram illustrating an example of threshold value distribution and coding of a memory cell array.

FIG. 5 is an explanatory diagram illustrating an example of threshold value distribution and coding of the memory cell array. FIG. 5 illustrates exemplary threshold value distribution of the 3 bit/Cell non-volatile memory 2. In the non-volatile memory 2, a threshold voltage of each memory cell transistor MT is set in accordance with each data value of multiple-value data stored in the memory cell transistor MT. Since electric charge injection into the electric charge accumulation layer 37 (electric charge storage region) is probabilistic, the threshold voltage of each memory cell transistor MT is statistically distributed as illustrated in FIG. 5.

A lower part of FIG. 5 illustrates threshold voltage distribution (threshold value distribution) with regions of eight lobes Er, A, B, C, D, E, F, and G where the threshold voltage is plotted in the horizontal direction and the number of memory cells (the number of cells) is plotted in the vertical direction. These regions are referred to as state Er, state A, State B, State C, state D, State E, State F, and state G. In the example illustrated in FIG. 5, eight-value data (three-bit data) can be stored in each memory cell transistor MT by setting the threshold voltage of the memory cell transistor MT to any of the eight states.

Voltages VA, VB, VC, VD, VE, VF, and VG are each a reference voltage as a boundary between states. In read operation, reading is performed by applying the voltages VA to VG as reading voltage to a word line WL, and accordingly, data reading can be performed by determining whether a target memory cell transistor MT is turned on or off.

Various kinds of methods can be employed as a coding method that associates data values with states (in other words, threshold value distribution) of a memory cell transistor MT. An upper part of FIG. 5 illustrates 2-3-2 coding as an example of coding.

In the example illustrated in FIG. 5, a memory cell transistor in state Er stores data (1, 1, 1), a memory cell transistor in state A stores data (0, 1, 1), a memory cell transistor in State B stores data (0, 0, 1), a memory cell transistor in State C stores data (0, 0, 0), a memory cell transistor in state D stores data (0, 1, 0), a memory cell transistor in State E stores data (1, 1, 0), a memory cell transistor in State F stores data (1, 0, 0), and a memory cell transistor in state G stores data (1, 0, 1).

A data group of higher bits, a data group of middle bits, and a data group of lower bits of each memory cell transistor are referred to as an Upper page, a Middle page, and a Lower page, respectively. Typically, reading is performed in the units of these pages.

In a case in which not reading in the units of pages but reading that determines whether a value that data stored in a memory cell transistor has among three bits is performed, reading voltage applied to a select word line WL needs to be changed seven times from the voltage VA to the voltage VG. However, in a case in which reading in the units of pages is performed, the reading can be performed by changing the voltage two or three times. Note that AR, BR, CR, DR, ER, FR, and GR in FIG. 5 indicate reading in which the reading voltages VA, VB, VC, VD, VE, VF, and VG, respectively, are applied.

For example, when the value of the Lower page of each memory cell transistor is read, the reading voltage needs to be changed two times to the voltage VA and the voltage VE. For example, in reading in which the reading voltage VA is applied to a select word line WL (AR in FIG. 5), when it is determined by the sense amplifier unit group 28 that a reading target memory cell transistor is in a conduction state, it can be determined that the Lower page of the reading target memory cell transistor is "1".

For example, in reading (AR) in which the reading voltage VA is applied to a select word line WL, when it is determined by the sense amplifier unit group 28 that a reading target memory cell transistor is in a non-conduction state, the Lower page of the reading target memory cell transistor is "0" or "1" with probability. Thus, subsequently, reading (ER) with the reading voltage VE is performed. As a result, when it is determined by the sense amplifier unit group 28 that the reading target memory cell transistor is in a conduction state, it can be determined that the Lower page of the reading target memory cell transistor is "0". When it is determined by the sense amplifier unit group 28 that the reading target memory cell transistor is in a non-conduction state, it can be determined that the Lower page of the reading target memory cell transistor is "1".

In this manner, in the 2-3-2 coding in FIG. 5, reading can be performed by changing the reading voltage two times for the Upper page, three times for the Middle page, and two times for the Lower page at maximum. Note that the coding illustrated in FIG. 5 is a Gray code in which data changes only by one bit between any two adjacent regions.

(Configurations of Sense Amplifier Unit and Data Register)

Figure 6:
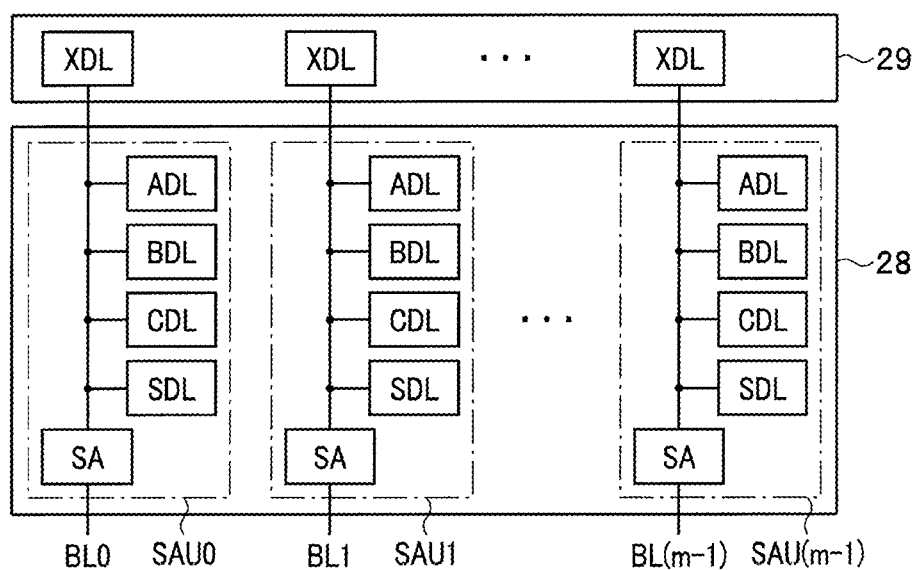
FIG. 6 is a block diagram illustrating an example of a sense amplifier unit group 28 and a data register 29 in FIG. 2.

FIG. 6 is a block diagram illustrating an example of the sense amplifier unit group 28 and the data register 29 in FIG. 2.

The sense amplifier unit group 28 includes sense amplifier units SAU0 to SAU(m−1) (hereinafter collectively referred to as sense amplifier units SAU) corresponding to bit lines BL0 to BL(m−1). Each sense amplifier unit SAU includes a sense amplifier SA and data latch circuits SDL, ADL, BDL, and CDL. The sense amplifier SA and the data latch circuits SDL, ADL, BDL, and CDL are connected to each other so that data forwarding is possible between the components.

The data latch circuits SDL, ADL, BDL, and CDL temporarily store data. In write operation, the sense amplifier SA controls voltage of the corresponding bit line BL in accordance with data stored in the data latch circuit SDL. The data latch circuits ADL, BDL, and CDL are used for multiple-value operation in which each memory cell transistor MT stores two bits or more of data. Specifically, the data latch circuit ADL is used to store writing data of the Lower page. The data latch circuit BDL is used to store writing data of the Middle page. The data latch circuit CDL is used to store writing data of the Upper page. The number of data latch circuits included in each sense amplifier unit SAU is determined in accordance with the number of bits stored in each memory cell transistor MT.

In read operation, the sense amplifier SA senses data read to the corresponding bit line BL and determines whether the data is "0" data or "1" data. In write operation, the sense amplifier SA applies voltage to the bit line BL based on writing data.

The data register 29 includes data latch circuits XDL in a number corresponding to the number of the sense amplifier units SAU0 to SAU(m−1). Each data latch circuit XDL is connected to the input-output circuit 21. Each data latch circuit XDL temporarily stores writing data transferred from the input-output circuit 21 and temporarily stores reading data transferred from the sense amplifier unit SAU. More specifically, data forwarding between the input-output circuit 21 and the sense amplifier unit group 28 is performed through each data latch circuit XDL corresponding to one page. Writing data received by the input-output circuit 21 is forwarded to any of the data latch circuits ADL, BDL, and CDL through the data latch circuit XDL. Reading data read by the sense amplifier SA is forwarded to the input-output circuit 21 through the data latch circuit XDL.

(Sense Amplifier Circuit)

Figure 7:
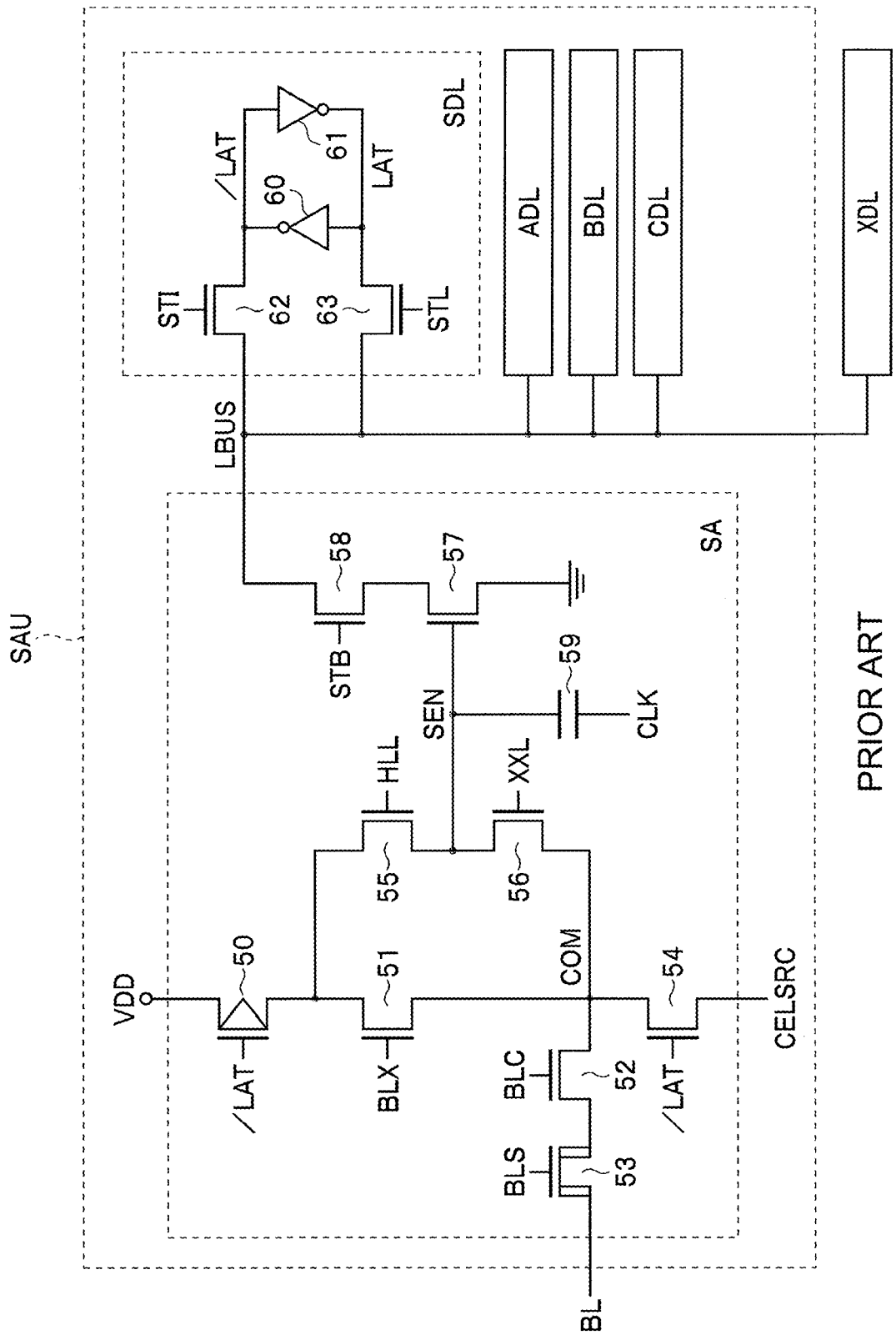
FIG. 7 is a circuit diagram illustrating an example of a specific configuration of a sense amplifier unit SAU in FIG. 6.

FIG. 7 is a circuit diagram illustrating an example of a specific configuration of each sense amplifier unit SAU in FIG. 6.

As illustrated in FIG. 7, the sense amplifier unit SAU includes the sense amplifier SA and the data latch circuits SDL, ADL, BDL, and CDL. The sense amplifier SA and the data latch circuits SDL, ADL, BDL, CDL, and XDL are connected to each other through a bus LBUS so that data reception is possible between the components.

The data latch circuit SDL includes, for example, inverters 60 and 61 and n-channel MOS transistors 62 and 63. An input node of the inverter 60 and an output node of the inverter 61 are connected to a node LAT. An input node of the inverter 61 and an output node of the inverter 60 are connected to a node /LAT. The inverters 60 and 61 store data at the nodes /LAT and LAT. Writing data is supplied to the node LAT. The data stored at the node /LAT is inversion data of the data stored at the node LAT.

A drain-source path of the transistor 62 has one end connected to the node /LAT and has the other end connected to the bus LBUS. A drain-source path of the transistor 63 has one end connected to the node LAT and has the other end connected to the bus LBUS. A control signal STL is input to a gate of the transistor 63, and a control signal STI is input to a gate of the transistor 62.

Note that, circuit configurations of the data latch circuits ADL, BDL, CDL, and XDL are same as a circuit configuration of the data latch circuit SDL, and thus description of the circuit configurations is omitted. Note that various kinds of control signals supplied to the sense amplifier unit SAU are provided from the control circuit 24.

The sense amplifier SA includes, for example, a p-channel MOS transistor 50 and n-channel MOS transistors 51 to 58, and a capacitor 59.

In read operation, the sense amplifier SA senses data read onto the corresponding bit line BL and determines whether the read data is "0" or "1". In program operation, the sense amplifier SA sets the corresponding bit line BL to a voltage value in accordance with writing data "0" or "1".

In the sense amplifier SA, the transistors 50 to 54 are involved in program operation. A source-drain path of the transistor 50 as a second transistor and a drain-source path of the transistor 51 are connected in series between a power source line that supplies a voltage VDD as an internal power voltage and a node COM. A drain-source path of the transistor 54 as a third transistor is connected between the node COM and a node CELSRC that supplies a voltage VSS as a ground voltage. A drain-source path of the transistor 52 as a first transistor and a drain-source path of the transistor 53 are connected in series between the node COM and the bit line BL.

Gates of the transistors 50 and 54 are connected to the node /LAT. Thus, when the node LAT is at a low level (hereinafter referred to as an L level) in accordance with "0" data, the node /LAT is maintained at a high level (hereinafter referred to as an H level), the transistor 50 is off, and the transistor 54 is on. When the node LAT is at the H level in accordance with "1" data, the node /LAT is maintained at the L level, the transistor 50 is on, and the transistor 54 is off.

In program operation, control signals HLL and XXL supplied to gates of the transistors 55 and 56, respectively, are at the L level, and the transistors 55 and 56 are off. A control signal BLX supplied to the transistor 51 is at the H level, and the transistor 51 is on. In normal program operation, the transistors 52 and 53 conduct electricity based on control signals BLC and BLS.

Thus, when "0" data is stored at the node LAT, the transistor 50 is turned off, the transistor 54 is turned on, and a bit line voltage such as the voltage VSS (for example, 0 V) from the node CELSRC is supplied to the bit line BL. When "1" data is stored at the node LAT, the transistor 50 is turned on, the transistor 54 is turned off, and the bit line voltage of, for example, 2.5 V is supplied to the bit line BL in accordance with the control signals BLC and BLS provided to the transistors 52 and 53.

(Verify Operation)

A verify operation is an operation that, after program operation, reads data at a memory cell transistor MT and determines whether the threshold voltage of the memory cell transistor MT has reached a desired state. The transistors 50 to 58 and the capacitor 59 of the sense amplifier SA are all involved in verify operation. A drain-source path of the transistor 55 and a drain-source path of the transistor 56 are connected in series between a drain of the transistor 50 and the node COM. A drain-source path of the transistor 58 and a drain-source path of the transistor 57 are connected in series between the bus LBUS and a reference voltage point. A source of the transistor 55 and a drain of the transistor 56 are connected to a sense node SEN, and the sense node SEN is connected to a gate of the transistor 57. The control signals HLL and XXL, voltage at the sense node SEN, and a control signal STB are applied to the gates of the transistors 55 to 58, respectively. A clock CLK is applied to the sense node SEN through the capacitor 59.

In verify operation, first, the row decoder 26 applies, to a select word line, a verify voltage Vvfy (for example, any of the voltages VA to VG in FIG. 5 or a voltage near the voltages VA to VG) corresponding to a target state and applies, to a non-select word line, a non-select reading voltage VREAD (for example, 5 to 7 V) that is higher than the voltages VA to VG.

In verify operation, the control circuit 24 first sets the node /LAT to the L level to turn on the transistor 50. In addition, the transistor 51 is turned on by the control signal BLX, and the control signal BLC and the control signal BLS are set to predetermined voltages, thereby fixing a bit line BL to a constant voltage (for example, 0.5 V). In addition, the control signal HLL is set to a predetermined voltage, thereby charging the sense node SEN to a predetermined precharge voltage Vpre higher than the voltage of the bit line BL. In this state, when the control signal XXL is set to the H level, current flows from the sense node SEN to the bit line BL through the transistors 56, 52, and 53, and the voltage at the sense node SEN gradually decreases.

The voltage at the sense node SEN changes in accordance with the state of the threshold voltage of a verify target memory cell (select memory cell). Specifically, when the threshold voltage of the select memory cell is lower than the verify voltage Vvfy, the select memory cell is on, large cell current flows to the select memory cell, and the voltage at the sense node SEN decreases at a faster speed. When the threshold voltage of the select memory cell is higher than the verify voltage Vvfy, the select memory cell is off, small or no cell current flows to the select memory cell, and the voltage at the sense node SEN decreases at a slower speed.

The transistor 57 is turned on or off in accordance with whether the voltage at the sense node SEN is the L level or the H level, when the control signal XXL is set to the L level and the control signal STB is set to the H level to turn on the transistor 58 at a first time point when a first duration has elapsed since electrical discharging start at which electric charge at the sense node SEN starts discharging, in other words, a time point when the first duration has elapsed since the control signal XXL is set to the H level.

For example, when the select memory cell is a writing insufficient cell, the threshold voltage of the cell is lower than the verify voltage Vvfy and a difference between both voltages is large, and accordingly, the select memory cell is completely on and large cell current flows to the select memory cell. Thus, the voltage at the sense node SEN rapidly decreases, a voltage decrease amount reaches a determination level before the first time point is reached, the sense node SEN becomes the L level at the first time point, and accordingly, no current flows from the bus LBUS to the reference voltage point since the transistor 57 is off.

When the select memory cell is a writing complete cell, the threshold voltage of the cell is higher than the verify voltage Vvfy, and accordingly, the select memory cell is off and extremely small or no cell current flows to the select memory cell. Thus, the voltage at the sense node SEN extremely gradually decreases, a voltage decrease amount does not reach the determination level before the first time point is reached, and the sense node SEN remains at the H level at the first time point. Accordingly, the transistor 57 is on, and current flows from the bus LBUS to the reference voltage point.

In this manner, selection between a writing insufficient cell and a writing complete cell can performed. Note that the above-described operation of the sense amplifier SA is merely exemplary. The control circuit 24 performs determination between a writing insufficient cell and a writing complete cell, controls the sense amplifier unit SAU based on a result of the determination, and sets the bit line voltage.

(Configuration of Row Decoder)

Figure 8A:
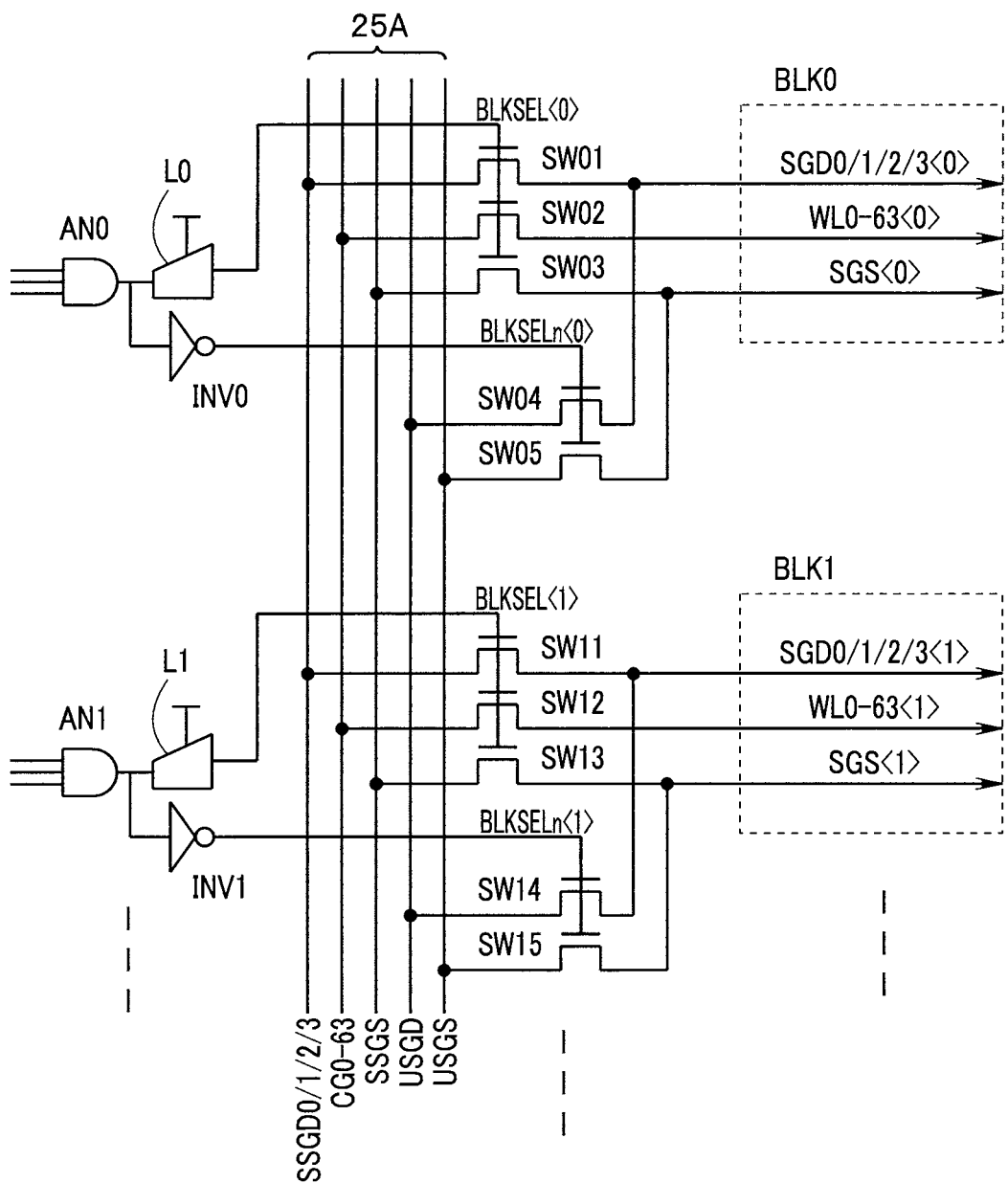
FIG. 8A is a block diagram illustrating an example of a row decoder 26 in FIG. 3.
Figure 8B:
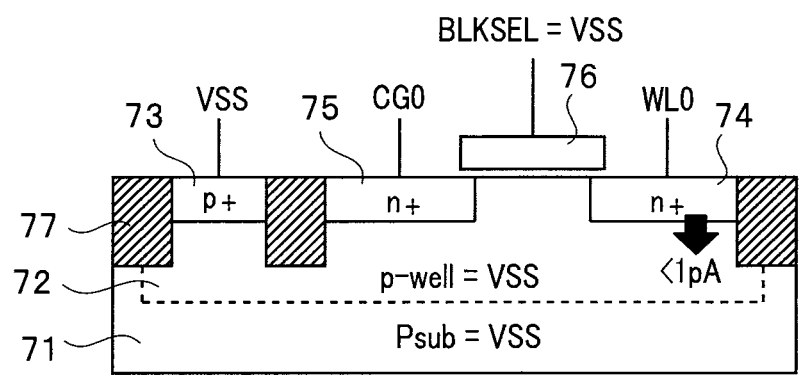
FIG. 8B is a diagram for description of a junction leakage characteristic of a switch included in the row decoder 26.

FIG. 8A is a block diagram illustrating an example of the row decoder 26 in FIG. 2. Although FIG. 8A illustrates only a circuit for the block BLK0 and a circuit for the block BLK1 in the row decoder 26, a circuit for any other block has a circuit configuration same as circuit configurations of these circuits. FIG. 8B is a diagram for description of a junction leakage characteristic of a switch included in the row decoder 26.

In description below, a select gate line SGD for selecting the memory cell transistors MT of a select string of a block BLK as a writing or reading target is referred to as selSGD, and a select gate line SGD for unselecting the memory cell transistors MT of a non-select string of the block BLK is referred to as uselSGD. In addition, a select gate line SGS for selecting the memory cell transistors MT of a writing or reading target BLK is referred to as selSGS, a select gate line SGD for unselecting a non-writing or reading target BLK is referred to as USGD, and a select gate line SGS for unselecting a non-writing or reading target BLK is referred to as USGS.

The wire group 25A from the voltage generation circuit 25 includes signal lines SSGD0/1/2/3 for supplying voltages of selSGD and uselSGD. Upon string unit address inputting in FIG. 20 to be described later, the voltage of selSGD is supplied to any one of the signal lines SSGD0/1/2/3, and the voltage of uselSGD is supplied to the remaining three signal lines. The wire group 25A also includes a signal line SSGS for supplying voltage to selSGS, the signal line USGD for supplying voltage to SGD of a non-writing or reading target BLK, and the signal line USGS for supplying voltage to SGS of a non-writing or reading target BLK. USGD and USGS are biased to VSS in writing and reading durations and a ready duration. The wire group 25A also includes signal line CG0, CG1, . . . (hereinafter collectively referred to as signal lines CG) for supplying voltages to respective word lines WL. Note that, in the example of FIG. 8A, the wire group 25A includes the signal lines CG0 to CG63 corresponding to word lines WL0 to WL63.

The row decoder 26 includes switches SW01 to SW05 (hereinafter collectively referred to as switches SW0) for the block BLK0, and switches SW11 to SW15, . . . (hereinafter collectively referred to as switches SW1) for the block BLK1. Note that the switches SW0, SW1, . . . are collectively referred to as switches SW. The signal lines SSGD0/1/2/3 are connected to the select gate lines SGD0/1/2/3<0>, SGD0/1/2/3<1>, . . . of the blocks BLK through the switches SWn1 (n is 0, 1, 2, . . . ). The signal lines CG are connected to the word lines WL0-63<0>, the word lines WL0-63<1>, . . . of the blocks BLK through the switches SWn2 (n is 0, 1, 2, . . . ). The signal line SSGS is connected to the select gate lines SGS<0>, SGS<1>, . . . of the blocks BLK through the switches SWn3 (n is 0, 1, 2, . . . ). The signal line USGD is connected to the select gate lines SGD0/1/2/3<0>, SGD0/1/2/3<1>, . . . of the blocks BLK through the switches SWn4 (n is 0, 1, 2, . . . ). The signal line USGS is connected to the select gate lines SGS<0>, SGS<1>, . . . of the blocks BLK through the switches SWn5 (n is 0, 1, 2, . . . ). Note that SWn1 and SWn4 include, in parallel, switches in a number equal to the number of strings. For example, one switch SW01 is illustrated in FIG. 8A for sake of simplicity, but in reality, four switches SW01 are provided between the four signal lines SSGD0/1/2/3 and the four select gate lines SGD0/1/2/3<0> and connect the signals lines to the select gate lines.

The row decoder 26 includes an AND circuit AN0, a high-voltage level shifter L0, and an inverter INV0 for controlling the switches SW0 for the block BLK0, and an AND circuit AN1, a high-voltage level shifter L1, and an inverter INV1 for controlling the switches SW1 for the block BLK1. A row address from the register 23 is provided to the AND circuits AN0, AN1, . . . (hereinafter collectively referred to as AND circuits AN). Outputs from the AND circuits AN0, AN1, . . . are provided to the high-voltage level shifters L0, L1, . . . (hereinafter collectively referred to as high-voltage level shifters L), respectively, and are provided to the inverters INV0, INV1, . . . (hereinafter collectively referred to as inverters INV), respectively.

Each switch SW may be configured of, for example, an NMOS transistor having a well structure illustrated in FIG. 8B. Specifically, in the switch SW, a P-well (p-well) 72 is formed in a predetermined region of a P-type semiconductor substrate (Psub) 71. The P-type semiconductor substrate (Psub) 71 and the P-well (p-well) 72 are biased to a VSS electrode through a p+ contact 73. In addition, a source region 74 and a drain region 75 are formed in the P-well 72. A gate electrode 76 made of a conductive material is provided on the semiconductor substrate between the source region 74 and the drain region 75 through a gate insulating film. The switch SW is constituted by the source region 74, the drain region 75, and the gate electrode 76. The drain region 75 is connected to a signal line CG, the source region 74 is connected to a signal line WL, and the p+ contact 73 is electrically separated from individual transistors by an element separation region 77.

In the ready state in which the signal R/Bn is, for example, at the H level, the row decoder 26 is in an operation stopped state, and all word lines WL of all blocks are in a floating state and have certain voltages due to influence of previous operation in some cases. Thereafter, as time elapses, WL finally becomes the bias voltage VSS of the P-well (p-well) 72 at a leakage destination due to a junction leakage (arrow in FIG. 8B) characteristic of SWn2. In the busy state in which the signal R/Bn is, for example, at the L level, the row decoder 26 is in an operation state, and various bias voltages such as the reading voltage, the program voltage, and the verify voltage are applied to the word lines WL of a select block BLK.

The output from any one of the AND circuits AN becomes a high level (hereinafter referred to as an H level), the output from any other AND circuit becomes a low level (hereinafter referred to as an L level), and accordingly, one of the blocks BLK0, BLK1, . . . is selected. In the block BLK for which the output from the AND circuit AN has become the H level, any switch having a current path connected to the signal lines SSGD0/1/2/3, the signal lines CG, and the signal line SSGS among the switches SW is turned on by an output from the high-voltage level shifter L, and any switch having a current path connected to the signal line USGD and the signal line USGS among the switches SW is turned off by the inverter INV. In any other block BLK for which the output from the AND circuit AN has becomes the L level, any switch having a current path connected to the signal lines SSGD0/1/2/3, the signal lines CG, and the signal line SSGS among the switches SW is turned off by an output (signal BLKSEL) from the high-voltage level shifter L, and any switch having a current path connected to the signal line USGD and the signal line USGS among the switches SW is turned on by the inverter INV.

Accordingly, in the selected block BLK, voltages from the signal lines SSGD0/1/2/3 and SSGS are supplied to the select gate lines SGD0/1/2/3 and SGS, and voltages from the signal lines CG are supplied to the word lines WL. Specifically, when the signal R/Bn is in the busy state, the signal BLKSEL of the selected block BLK becomes the H level, and waveforms of the signal lines CG become substantially identical to waveforms of the word lines WL of the select block BLK. In a non-select block BLK, voltages from the signal lines USGD and USGS are supplied to the select gate lines SGD0/1/2/3 and SGS. The word lines WL become the floating state and finally become the voltage VSS due to the junction leakage characteristic of SWn2 as time elapses.

(Write Operation 1)

Figure 9:
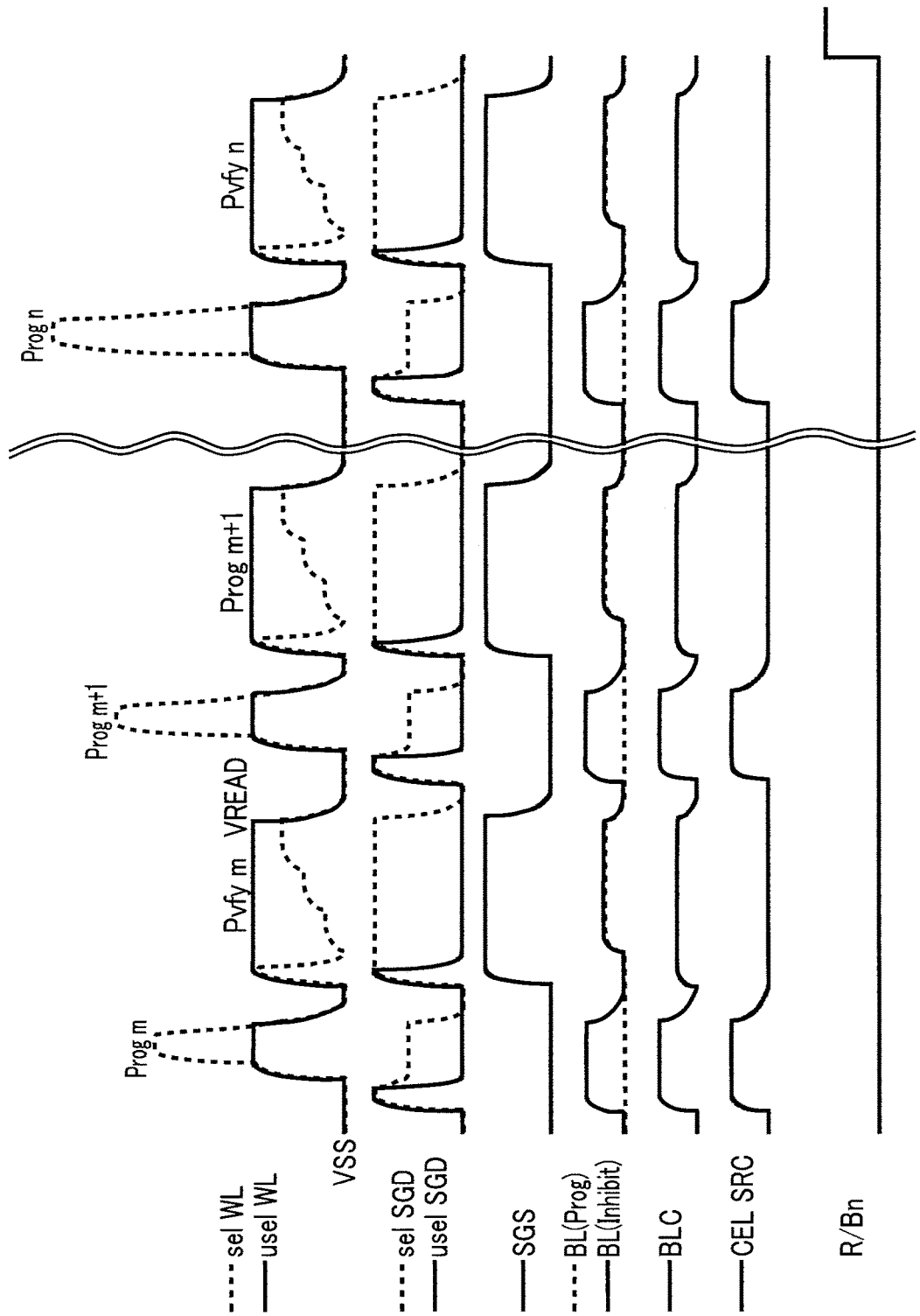
FIG. 9 is a waveform diagram illustrating a write operation, with time in the horizontal direction and voltage in the vertical direction.

FIG. 9 is a waveform diagram illustrating a write operation, with time in the horizontal direction and voltage in the vertical direction.

When data is written to a memory cell transistor MT, the threshold voltage of the memory cell transistor MT is set to a value in accordance with a value of the data. When a program voltage VPGM and a bit line voltage are applied to the memory cell transistor MT, electrons are injected into the electric charge accumulation layer 37 and the threshold voltage increases. The number of injected electrons can be increased by increasing the program voltage VPGM, and accordingly, the threshold voltage of the memory cell transistor MT can be increased. However, even when the same program voltage VPGM is applied, the number of injected electrons is different among memory cell transistors MT due to variance among the memory cell transistors MT. Once injected, electrons are stored until erasure operation is performed. Thus, program operation and verify operation for verification of program operation (loop) are performed a plurality of times as the program voltage VPGM is gradually increased without exceeding a range of a threshold voltage that is allowable as a threshold voltage to be set to each memory cell transistor MT. Note that erasure operation that returns the threshold voltage of the memory cell transistor MT to state Er (erased state) is performed first at write operation.

In this manner, in write operation, a program loop made of program operation and verify operation is repeated a plurality of times, and the program voltage VPGM increases at each loop. In an example illustrated in FIG. 9, write operation is performed in n times of loops, program Prog 1 and verify Pvfy 1 are performed in the first loop, program Prog 2 and verify Pvfy 2 are performed in the second loop, and program Prog n and verify Pvfy n are performed in the n-th loop.

FIG. 9 illustrates waveforms at the m-th loop and later. Specifically, FIG. 9 illustrates that program Prog m and verify Pvfy m are performed in the m-th loop, program Prog m+1 and verify Pvfy m+1 are performed in the (m+1)-th loop, and program Prog n and verify Pvfy n are performed in the n-th loop.

In program operation, the program voltage VPGM (dashed line) that gradually increases at each loop is applied to a select word line WL (hereinafter also referred to as selWL), and a predetermined voltage VPASS (solid line) lower than the program voltage VPGM is applied to a plurality of non-select word lines WL (hereinafter also referred to as uselWL) other than the select word line WL. In program operation, the ground voltage VSS is applied to a select gate line SGS, a voltage (dashed line) that turns on the select gate transistor ST1 is applied to selSGD, and a voltage (solid line) that turns off the select gate transistor ST1 is applied to uselSGD. The ground voltage VSS (dashed line) is provided to a bit line BL (Prog) connected to a memory cell transistor MT on which writing is performed, and a predetermined voltage (solid line) is provided to a bit line BL (Inhibit) connected to the other memory cell transistors MT on which writing is not performed. Note that a predetermined voltage is applied to the source line CELSRC to more reliably turn off the select gate transistor ST2.

Accordingly, electric charge (electrons) in accordance with the program voltage VPGM is injected into the electric charge accumulation layer of the memory cell transistor MT on which writing is performed, and the threshold voltage of the memory cell transistor MT increases. Electron injection into the electric charge accumulation layer of each memory cell transistor MT on which writing is not performed is prohibited, and accordingly, the threshold voltage of the memory cell transistor MT is maintained.

In verify operation, the verify voltage (dashed line) corresponding to each state is applied to a select word line selWL, and the predetermined voltage VREAD (solid line) that turns on memory cell transistors MT is applied to the other non-select word lines uselWL. In verify operation, a voltage that turns on the select gate transistor ST2 is applied to a select gate line SGS, a voltage (dashed line) that turns on the select gate transistor ST1 is applied to selSGD, and a voltage (solid line) that turns off the select gate transistor ST1 is applied to uselSGD. A predetermined voltage is applied to a bit line BL, and the ground voltage VSS is provided to the source line CELSRC. As illustrated in FIG. 9, a write operation is performed in a duration (busy duration) in which the signal R/Bn is at the L level, and the signal R/Bn becomes the H level when the write operation ends.

Note that, to apply a predetermined voltage to a bit line BL, the control signal BLC is supplied to the transistor 52 in a sense amplifier unit SAU as described above. Specifically, the transistor 52 connected to a bit line BL connected to a memory cell transistor MT on which writing is performed is provided with the control signal BLC at a relatively high level at program and is provided with the control signal BLC at a relatively low level at verify. Accordingly, at verify, the bit line BL is fixed to a relatively low constant voltage (for example, 0.5 V) as described above.

Accordingly, current is likely to flow through a channel when the verify voltage applied to selWL connected to a reading target memory cell transistor MT is higher than the threshold voltage, and current is unlikely to flow through the channel when the verify voltage applied to selWL is lower than the threshold voltage. Whether the threshold voltage of the memory cell transistor MT has reached a desired state can be determined by performing reading that detects a state of current flowing through the channel by the sense amplifier unit group 28. Note that, a case in which the threshold voltage of the memory cell transistor MT reaches a desired state is expressed as "verify passed", and a case in which the desired state is not reached is expressed as "verify failed".

(Creep-Up)

Figure 10:
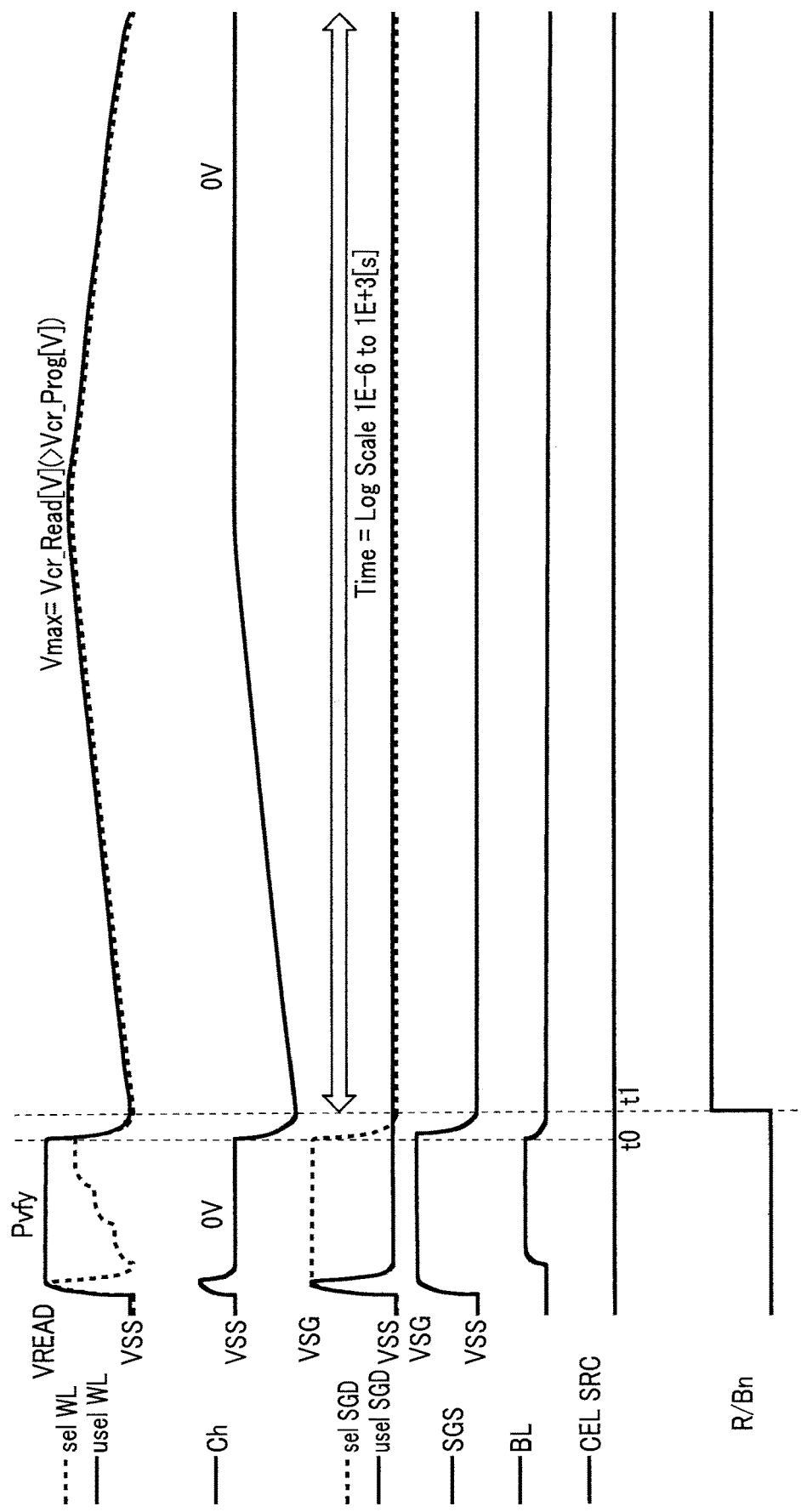
FIG. 10 is a waveform diagram for description of creep-up of a word line WL after the operation in FIG. 9.

FIG. 10 is a diagram for description of word line (WL) creep-up of a selected block after verify is performed and all blocks are unselected before a write sequence ends. FIG. 10 illustrates a voltage waveform of each component, with time in the horizontal direction and voltage in the vertical direction. Note that, in FIG. 10, a duration with an arrow indicated is in log scale, scale at a left end of the arrow is in the order of $10^{-6}$ seconds, and scale at a right end of the arrow is in the order of $10^3$ seconds. Hereinafter, this notation is expressed as Time=Log Scale 1E−6 to 1E+3[s].

In FIG. 10, selWL and uselWL represent a select word line and a non-select word line, respectively, Ch represents a channel region, SGS represents a select gate line SGS, BL represents a bit line BL, and CELSRC represents a source line. As described above, a select gate line SGD for driving a writing or reading target memory cell transistor MT is referred to as selSGD, and a select gate line SGD other than selSGD is referred to as uselSGD.

In the memory cell array 20 having a three-dimensional structure, the channel region of each memory cell transistor MT is not directly connected to the substrate (in other words, the p-type well region 30) but is connected to a bit line BL and the substrate, respectively, through the select gate transistors ST1 and ST2. Thus, when the select gate transistors ST1 and ST2 are cut off, electric charge in the channel region cannot easily move to the bit line BL and the substrate but slowly leaves as leakage current of the select gate transistors ST1 and ST2.

In the present embodiment, a phenomenon that the voltage of a word line WL increases due to capacitive coupling between the channel region of a memory cell transistor MT (or channel region of a NAND string NS) and the word line WL is referred to as WL creep-up.

For example, verify (program verify) after program operation is performed as data read operation. At a time point in program verify, for example, the channel region voltage (Ch) is equal to the ground voltage VSS (0 V), the select word line WL is at the verify voltage Pvfy (dashed line), the non-select word line is at the voltage VREAD (solid line), the select gate line SGD of a select string is at selSGD, the select gate line SGS is at a voltage VSG, and the select gate line SGD of a non-select string is at uselSGD (in this example, the voltage VSS). Note that a predetermined voltage is applied to the bit line BL, and the source line CELSRC is at the ground voltage VSS. At time point t0, when the read operation ends, each voltage is reset to VSS or a voltage close to VSS through electrical discharging so that a writing state of a memory cell does not change, and then the block selection signal BLKSEL is reset to the L level to cut off from the SSGD0/1/2/3, CG0-63, and SSGS lines, and BLKSELn is returned to the H level to connect USGD and USGS to the select gate lines of a block BLK, respectively. When BLKSEL is reset to L, WL is biased by no switch and thus becomes floating. After these predetermined operations end, the signal R/Bn is changed from the L level to the H level to return to the ready state.

In this case, the voltage of the channel region of the NAND string NS decreases to be negative due to capacitive coupling between the word line WL and the channel region (time point t1). Thereafter, electric charge of the channel region gradually leaves to the substrate and/or the bit line BL by leakage current, and the voltage of the channel region returns to the ground voltage VSS (0 V). When the voltage of the channel region returns to the ground voltage VSS, the word line WL in capacitive coupling with the channel region increases to a creep-up voltage. Thereafter, the voltage of the word line WL after the creep-up gradually decreases due to junction leakage current of a transistor switch SWn2 that drives the word line WL. Specifically, the WL creep-up occurs after the row decoder 26 becomes the operation stopped state through transition from the ready state to the busy state (transition of the signal R/Bn from the L level to the H level). Note that a maximum value Vmax of the creep-up voltage is Vcr_Read (>Vcr_Prog) V.

A state of the memory cell transistor MT when the word line WL has not crept up is referred to as a 1st read state, and a state of the memory cell transistor MT when the word line WL has crept up is referred to as a 2nd read state. Note that the WL creep-up occurs not only at program verify but also at data normal reading.

Typically in a three-dimensional NAND, cell current flows through a channel formed in polysilicon. There are a larger number of trapping levels in the channel, and a threshold value of a cell appears to vary depending on a degree of occupation of electrons in the trapping levels. When reading is performed from a state that is not used for a long time, the word line WL is completely electrically discharged to 0 V, electrons occupy trapping levels directly below the gate insulating film 36 at a low ratio, interference of current is small, and the threshold value of the cell appears lower. However, once reading is performed, electrons occupy these trapping levels at a certain ratio and interfere with current, and thus the threshold value of the cell appears higher. The former state is the 1st read state, the latter state is the 2nd read state, and the cell threshold values of the states are observed as a difference of several tens mV approximately, which tends to increase the number of reading error bits of a cell in a TLC or QLC product, in particular. Thus, to reliably read data, reading needs to be performed in any one of the 1st read state and the 2nd read state. A relatively long time period is needed to return the 1st read state after transition to the 2nd read state through write operation and read operation, and thus reading is preferably performed in the 2nd read state.

Thus, for example, in a method, the 2nd read state is maintained by refresh read operation that performs reading voltage application operation (all-string read operation) using a pulse (hereinafter referred to as an all-string read pulse) that periodically provides a voltage, such as the voltage VREAD, which causes conduction of memory cell transistors MT, to the word lines WL of all strings of all blocks. Specifically, the voltage applied to the word lines WL in the all-string read operation is substantially equal to a value of a voltage that causes conduction to non-selected memory cell transistors MT among a plurality of memory cell transistors MT in read operation on a selected memory cell transistor MT among the plurality of memory cell transistors MT. In the above-described (write operation 1), since verify as read operation is performed in the last loop of write operation, the 2nd read state can be maintained for a predetermined time period after write operation, and thus refresh read operation using the all-string read pulse is unnecessary.

Note that, although it is described above that the all-string read operation applies the all-string read pulse to the word lines WL of all strings in each block, the all-string read pulse may be applied to some word lines WL of all strings as long as the 2nd read state can be maintained.

(Write Operation 2)

Figure 11:
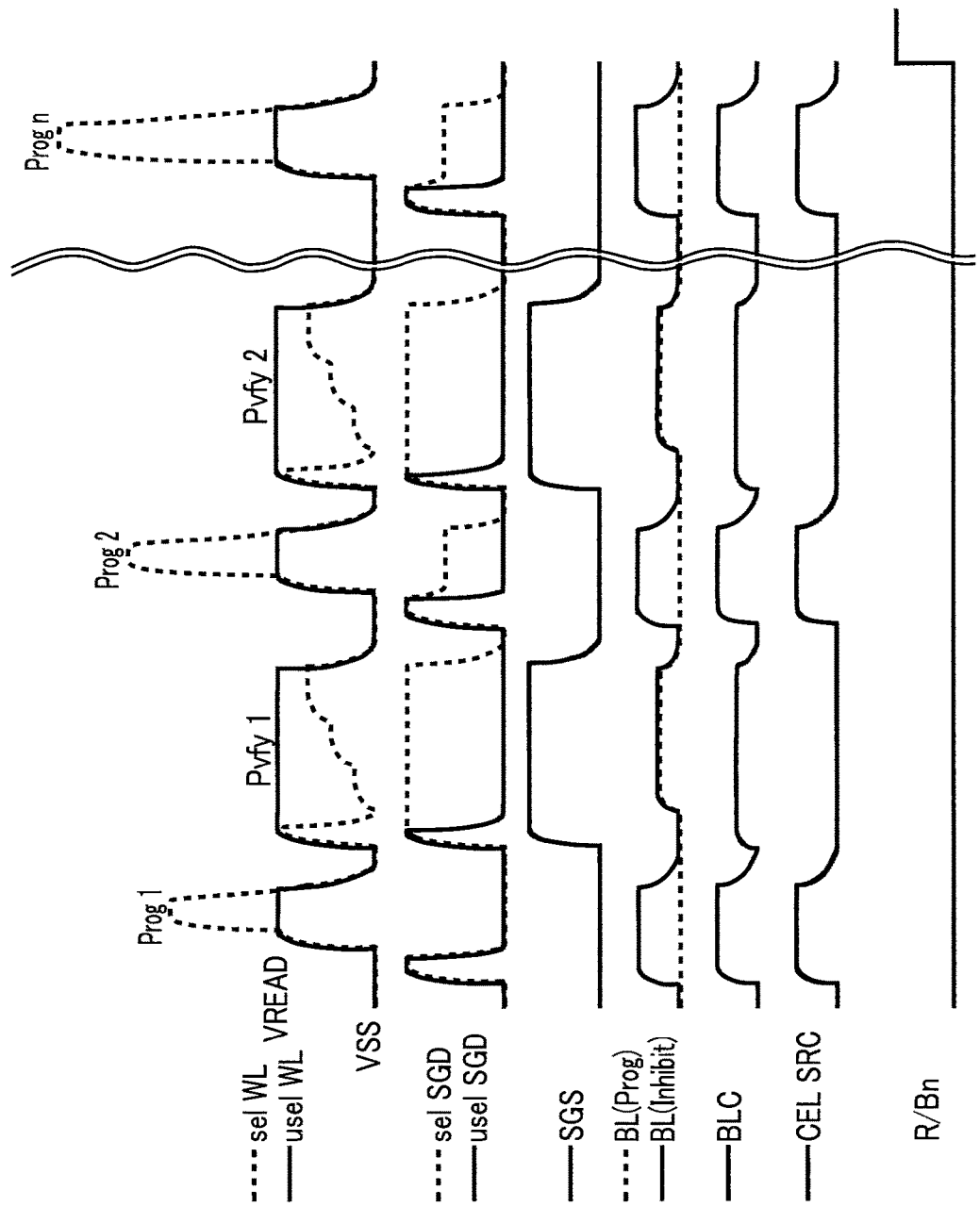
FIG. 11 is a waveform diagram illustrating another example of the write operation, with time in the horizontal direction and voltage in the vertical direction.
Figure 12:
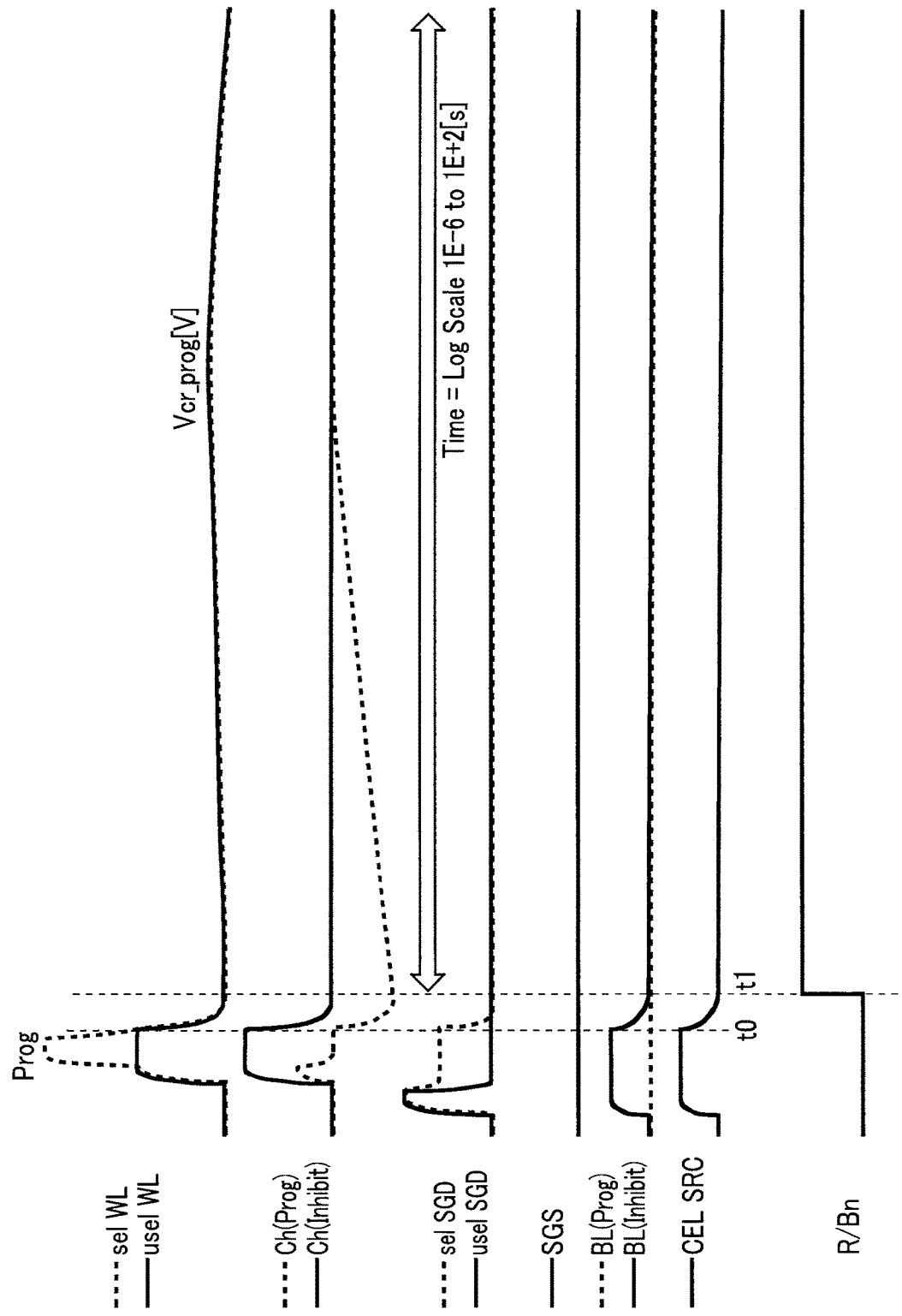
FIG. 12 is a waveform diagram for description of creep-up of the word line WL after the operation in FIG. 11.

A method that omits verify in the last loop of write operation is sometimes employed to shorten the writing time period tPROG. FIG. 11 is a waveform diagram illustrating another example of write operation, with time in the horizontal direction and voltage in the vertical direction. In the example of FIG. 11, verify in the last loop of write operation is omitted. FIG. 12 is a waveform diagram for description of the WL creep-up in this case. Note that scale in the horizontal direction in FIG. 12 is Time=Log Scale 1E–6 to 1E+2[s].

As understood from comparison between FIGS. 11 and 9, a program operation and a verify operation are performed in a penultimate loop (n–1th loop), and the program operation is performed but the verify operation is omitted in the last loop (n-th loop). In this case as well, the WL creep-up occurs in an H level duration (ready duration) of the signal R/Bn in FIG. 12. However, since the number of writing cells is small in the last loop, a relatively large number of channels become the floating state (solid line Ch (Inhibit) before t0 in FIG. 12) in accordance with the program voltage, and the voltages of an extremely small number of channel regions become the ground voltage VSS (0 V; dotted line Ch (Prog) before t0 in FIG. 12). Thus, when a word line WL is electrically discharged from the program voltage to the ground voltage VSS, the number of channels, the channel voltage of which decreases to be negative is small, and as a result, a voltage of the WL creep-up decreases as well.

Specifically, when write operation ends after last program pulse application in the program loop, a degree of the WL creep-up is small and return to the 1st read state is likely to occur right after the last program pulse application. Thus, after the last program pulse application, the 2nd read state may be set by using a pulse (in other words, the all-string read pulse) that provides, for example, the voltage VREAD to all word lines WL in the block.

(All-String Read Operation)

Figure 13:
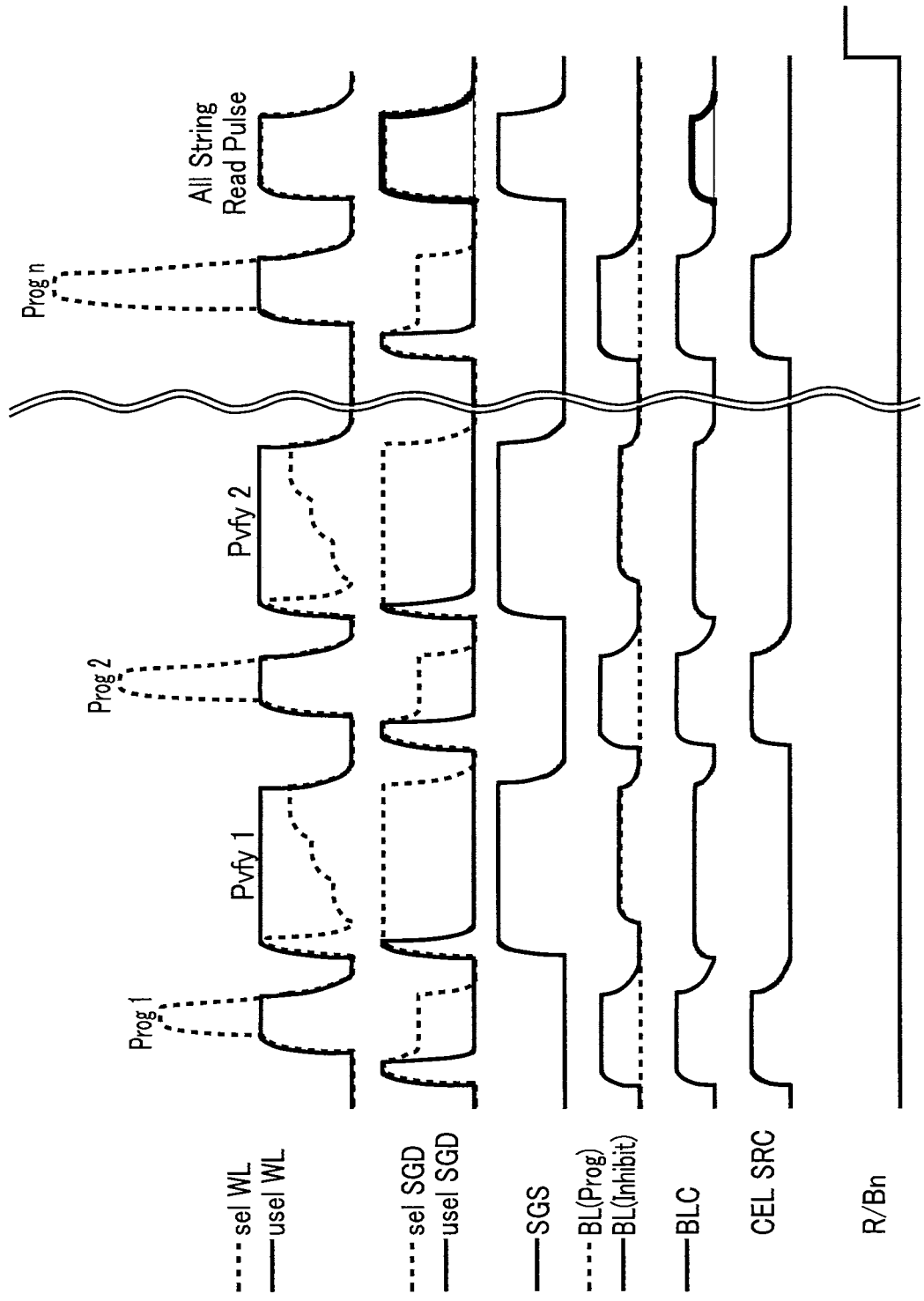
FIG. 13 is a waveform diagram illustrating another example of the write operation, with time in the horizontal direction and voltage in the vertical direction.

FIG. 13 is a waveform diagram illustrating another example of the write operation, with time in the horizontal direction and voltage in the vertical direction. In the illustrated example, the all-string read operation as the first voltage application operation is performed last in the program loop.

As understood from comparison between FIGS. 11 and 13, in the example of FIG. 13, verify operation is omitted in the last loop (the n-th loop), and for example, the voltage VREAD is applied to both selWL and uselWL after program operation. Note that, in this case, selSGD, uselSGD, and the select gate line SGS are set to a voltage (bold line) that turns on the select gate transistors ST1 and ST2, the control signal BLC is set to a predetermined voltage (bold line), and accordingly, the ground voltage VSS is supplied to the bit line BL. Note that CELSRC is set to the ground voltage VSS. The control signals HLL and XXL are at the L level, and the control signal BLS and the node /LAT are at the H level. The transistors 50, 55, and 56 are off, and the transistors 52, 53, and 54 are on. Accordingly, in the last loop, the all-string read operation is performed after program operation, and then write operation ends, and transition to the 2nd read state is performed.

Note that the ground voltage VSS can be supplied from the source line CELSRC to the bit line BL when the select gate transistor ST2 is turned on. Thus the select gate transistor ST1 does not necessarily need to be turned on. In this case, as illustrated with a thin line, selSGD, uselSGD, and the control signal BLC may be at the ground voltage VSS.

Specifically, in the all-string read operation, no select word line WL exists, and a voltage such as VREAD is applied to all word lines WL of all NAND strings NS. In the all-string read operation, sensing by the sense amplifier unit group 28 is unnecessary and the voltage of the bit line BL does not need to be changed, and thus operation is simple. As understood from comparison between FIGS. 9 and 13, a time period taken for the all-string read operation is shorter than a time period taken for program verify.

However, in the example illustrated in FIG. 13, the writing time period tPROG increases by the time period taken for the all-string read operation compared to the writing time period tPROG in the write operation in FIG. 11 although the increase is shorter than the time period taken for program verify.

(Control by Control Circuit)

Thus, in the present embodiment, in write operation, the control circuit 24 determines, for each select word line to which the program voltage is applied, whether to omit the all-string read operation that provides a read pulse to all strings before write operation performed by the word line ends. Specifically, in write operation performed for each word line, in other words, for each cell unit CU, it is determined whether the all-string read operation is performed or omitted before write operation of the cell unit CU ends. When the all-string read operation is omitted, the time period tPROG is shortened accordingly. In other words, in the present embodiment, for each select word line WL to which the program voltage is supplied in write operation, it is determined whether to perform the all-string read operation after program operation using the select word line WL. In the present embodiment as described above, the writing time period tPROG on average can be shortened by providing, for write operation of one block BLK, select word lines for which the all-string read operation is performed and select word lines for which the all-string read operation is not performed.

In description below, a predetermined word line WL to which the program voltage VPGM is applied when the all-string read operation is performed after program operation using the predetermined word line WL is referred to as an all-string read operation target word line WL, and a predetermined word line WL to which the program voltage VPGM is applied when the all-string read operation is not performed after program operation using the predetermined word line WL is referred to as a non all-string read operation target word line WL. In the present embodiment, the control circuit 24 determines the all-string read operation target word line WL and the non all-string read operation target word line WL to reduce the writing time period tPROG and efficiently generate the 2nd read state.

Figure 14:
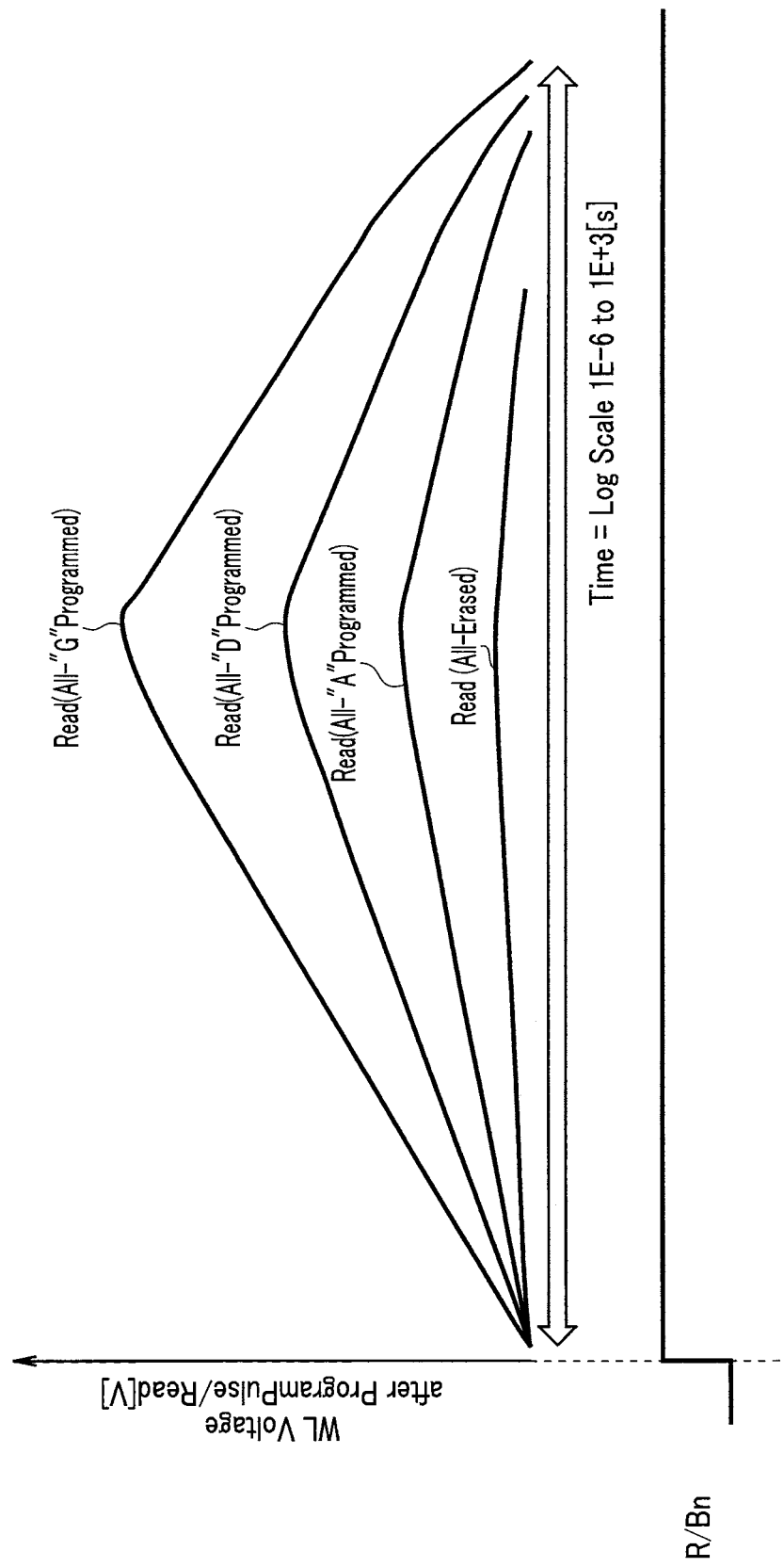
FIG. 14 is a waveform diagram for description of a method of determining an all-string read operation target word line WL or a non all-string read operation target word line WL, with time in the horizontal direction and voltage in the vertical direction.
Figure 15:
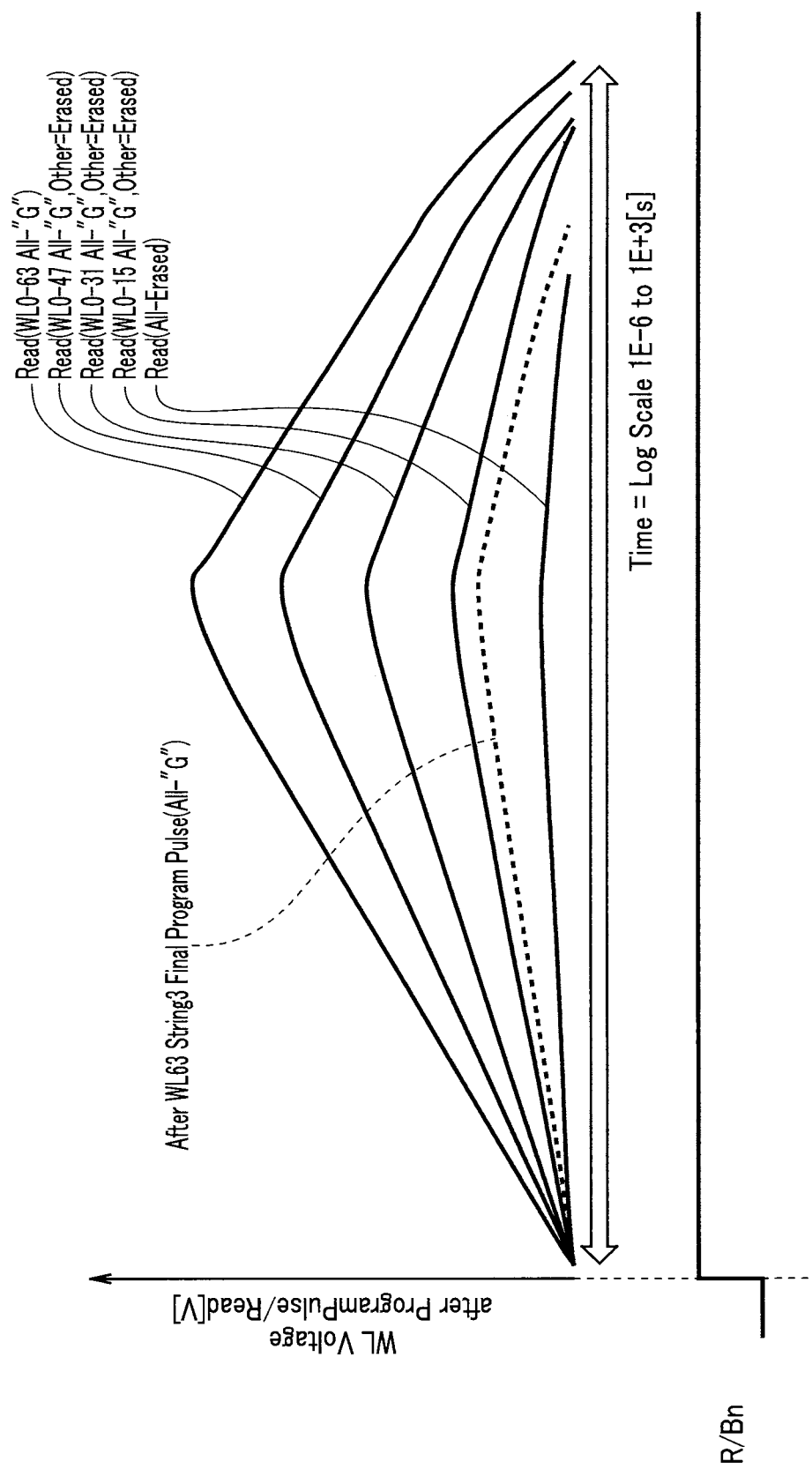
FIG. 15 is a waveform diagram for description of a method of determining an all-string read operation target word line WL or a non all-string read operation target word line WL, with time in the horizontal direction and voltage in the vertical direction.

FIGS. 14 and 15 are waveform diagrams for description of a method of determining the all-string read operation target word line WL or the non all-string read operation target word line WL, with time in the horizontal direction and voltage in the vertical direction. Note that scale in the horizontal direction illustrated in each of FIGS. 14 and 15 is Time=Log Scale 1E−6 to 1E+3 [s].

FIG. 14 illustrates, for each cell writing state, an amount of the WL creep-up (in the ready duration of the signal R/Bn) after all memory cell transistors MT in a block are written to the same state and then the all-string read operation is performed.

"Read (All-Erased)" indicates the WL creep-up due to the all-string read operation when all memory cell transistors MT in the block are in state Er, and "Read (All-"A" Programmed)" indicates the WL creep-up due to the all-string read operation when all memory cell transistors MT in the block are written to state A. Similarly, "Read (All-"D" Programmed)" and "Read (All-"G" Programmed)" indicate the WL creep-up due to the all-string read operation when all memory cell transistors MT in the block are written to state D and state G, respectively.

As understood from FIG. 14, the voltage of the WL creep-up is higher for the all-string read operation when writing is made to a state at a higher threshold voltage.

FIG. 15 illustrates a relation with the WL creep-up voltage generated in the ready duration (H level duration) of the signal R/Bn after the all-string read operation in a process of writing performed in a block. Note that a case in which a total number of word lines WL is 64 is illustrated. "Read (All-Erased)" indicates change of the WL creep-up voltage after the all-string read operation when all cells in a block are in state Er (erased state). "Read(WL0-15 All-"G", Other=Erased)" indicates change of the WL creep-up voltage after the all-string read operation when data of state G is recorded in all memory cell transistors MT connected to word lines WL of numbers 0-15 in a block and the other memory cell transistors MT are in state Er. Typically, before data writing, erasure operation is performed and application of the program voltage for write operation is sequentially performed, for example, from the word line WL of number 0 (small number) to the word line WL of a larger number. "Read(WL0-15 All-"G", Other=Erased)" indicates change of the WL creep-up voltage after the all-string read operation after writing of state G to all memory cell transistors MT connected to 16 word lines WL in a block.

Similarly, "Read(WL0-31 All-"G", Other=Erased)" indicates change of the WL creep-up voltage after the all-string read operation after writing of state G to all memory cell transistors MT connected to 32 word lines WL in a block. "Read(WL0-47 All-"G", Other=Erased)" indicates change of the WL creep-up voltage after the all-string read operation after writing of state G to all memory cell transistors MT connected to 48 word lines WL in a block. "Read(WL0-63 All-"G", Other=Erased)" indicates change of the WL creep-up voltage after the all-string read operation after writing of state G to all memory cell transistors MT connected to all 64 word lines WL in a block.

A dotted-line waveform "After WL63 String3 Final Program Pulse (All-"G")" indicates change of the WL creep-up voltage after the last loop in write operation of a block includes only program operation. It is understood that, when write operation ends right after program operation, the WL creep-up voltage is low and transition to the 1st read state is likely to occur.

As understood from FIG. 15, as the number of word lines WL to which the program voltage is applied for write operation is larger, change of the WL creep-up voltage after the all-string read operation thereafter is larger. When the number of word lines WL to which the program voltage is applied for write operation is small, change of the WL creep-up voltage due to the all-string read operation after write operation is relatively small. Specifically, in a state in which the number of word lines WL to which the program voltage is applied in write operation is small, the degree of the WL creep-up is small, and thus when the all-string read operation is performed after program pulse application, transition to the 1st read state occurs in a relatively short time period, and the all-string read operation has a small effect. Thus, it is thought that the all-string read operation may be omitted.

Typically, the state of data recorded in each memory cell transistor MT of the memory cell array 20 is randomized, the writing illustrated in FIG. 14 is hardly performed, and it is difficult to employ a method of controlling the all-string read operation for each state.

Thus, based on the knowledge of FIG. 15, in a state in which the number of word lines WL to which the program voltage is applied in write operation is small, the control circuit 24 omits the all-string read operation to reduce the writing time period tPROG. Thereafter, in program operation using word lines WL, the control circuit 24 performs the all-string read operation before write operation ends, thereby causing transition to the 2nd read state.

The number of word lines WL to which the program voltage is applied when the all-string read operation is performed is preferably changeable in accordance with characteristics of a device. Thus, information (hereinafter referred to as all-string read operation information) indicating the number of word lines WL to which the program voltage is applied when the all-string read operation is performed is preferably recorded and stored in, for example, the block BLKX of the memory cell array 20, and the recorded all-string read operation information is preferably changeable as appropriate. Note that the block BLKX is a region in which information related to operation of the non-volatile memory 2 is stored.

After power-on, the control circuit 24 may read the all-string read operation information from the block BLKX of the memory cell array 20, store the read all-string read operation information in a register 24a, and control the all-string read operation based on the information. Note that the register in which the all-string read operation information is stored may be provided in the logic control circuit 22.

(Effects)

Figure 16:
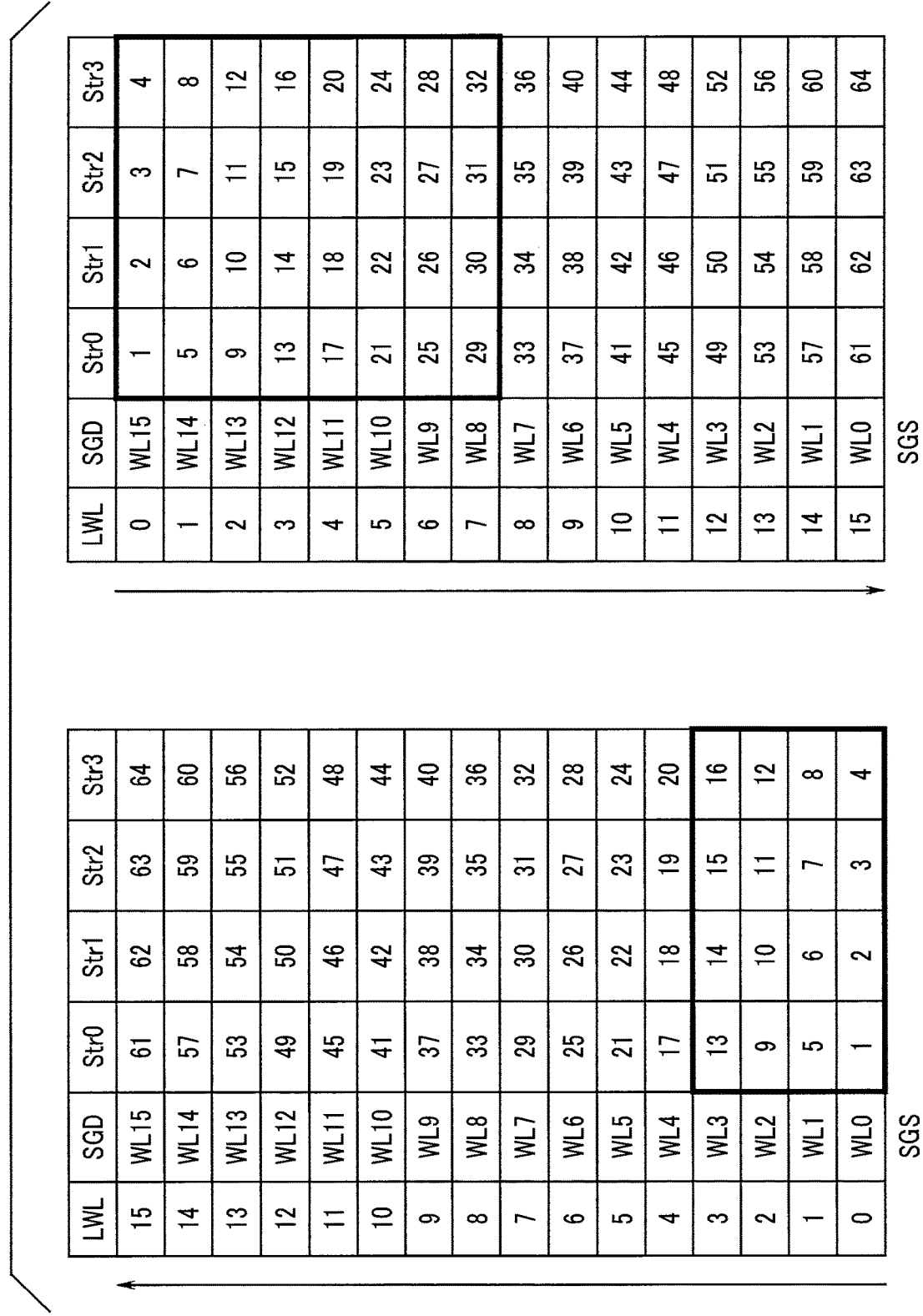
FIG. 16 is an explanatory diagram for description of operation of a first embodiment.

Operation of the embodiment thus configured will be described below with reference to an explanatory diagram in FIG. 16. FIG. 16 illustrates a duration in which the all-string read operation is stopped (or performed).

FIG. 16 illustrates an example in which a block BLK is constituted by four string units Str0, Str1, Str2, and Str3 and a NAND string NS is constituted by 16 memory cell transistors MT (16 word lines WL). Note that the number of string units in the block BLK and the number of word lines WL in the NAND string NS are not limited to the above-described numbers.

A number in each cell in columns of Str0 to Str3 in FIG. 16 indicates a writing order for one cell unit CU connected to one word line WL in one string unit. Specifically, one word line WL is included in four cell units CU for each string unit. In the example of FIG. 16, the word line WL number changes from WL0, WL1, WL2, ..., and WL15 for a word line WL disposed on a select gate line SGS side to a word line WL disposed on a select gate line SGD side. An order of data writing to the cell units CU for each word line WL is an order of the word lines WL of numbers WL0, WL1, WL2, ..., and WL15 in an example on a left side in FIG. 16 as indicated by an arrow, and is an order of word lines WL of numbers WL15, WL14, WL13, and WL0 in an example on a right side in FIG. 16 as indicated by the arrow. In other words, data writing to the cell units CU for each word line WL is sequentially performed from the select gate line SGS side and also sequentially performed from the select gate line SGD side. A word line WL, the number of which increases from zero in accordance with the writing order is referred to as a logic word line number LWL. Thus, when the word lines WL are expressed with the logic word line numbers LWL, writing is always performed in ascending order of the number.

In the present embodiment, after power-on, the control circuit 24 reads the all-string read operation information from the block BLKX of the memory cell array 20 and stores the read all-string read operation information in the register 24a. In write operation, the control circuit 24 controls the all-string read operation based on the all-string read operation information.

For example, the all-string read operation information specifies "0", "1", "2", ... in F_ASTRREAD_BORDER 0:LWL0- (disable), 1:LWL4-, 2:LWL8-, 3:LWL12-, .... For example, "0" of the all-string read operation information indicates that no WL for which the all-string read operation is omitted is set, in other words, the all-string read operation is executed for all word lines WL. In addition, "1" of the all-string read operation information indicates that the all-string read operation is omitted in a duration of the logic word line number LWL of 0-3 and the all-string read operation is executed in a duration of the logic word line number LWL of 4-15. A bold frame on the left side in FIG. 16 indicates WL for which the all-string read operation is omitted.

In this case, the control circuit 24 performs, for cell units CU to which the program voltage is applied by the logic word lines LWL of numbers 0-3, write operation that does not perform the all-string read operation, in other words, the write operation illustrated in FIG. 11. In this case, the control circuit 24 performs, for cell units CU to which the program voltage is applied by the logic word lines LWL of numbers 4-15, the write operation illustrated in FIG. 13, which performs the all-string read operation before write operation ends.

For example, "2" of the all-string read operation information indicates that the all-string read operation is omitted in a duration of the logic word lines LWL of numbers 0-7 and the all-string read operation is executed in a duration of the logic word lines LWL of numbers 8-15. A bold frame on the right side in FIG. 16 indicates WL for which the all-string read operation is omitted.

Specifically, in this case, the control circuit 24 performs, for cell units CU to which the program voltage is applied by the logic word lines LWL of numbers 0-7, write operation that does not perform the all-string read operation, in other words, the write operation illustrated in FIG. 11. In this case, the control circuit 24 performs, for cell units CU to which the program voltage is applied by the logic word lines LWL of numbers 8-15, the write operation illustrated in FIG. 13, which performs the all-string read operation before write operation ends.

In this manner, at write operation, all-string read operation target word lines WL for which all-string read operation is performed before write operation ends for each cell unit CU, and non all-string read operation target word lines WL are determined, and the all-string read operation is omitted in write operation by the non all-string read operation target word lines WL. As a result, the writing time period tPROG can be reduced. When the all-string read operation is performed before write operation using an all-string read operation target word line WL ends, sufficient WL creep-up occurs and thus the 2nd read state can be efficiently maintained.

In this manner, in the first embodiment, since reading by the all-string read operation is omitted before write operation using some word lines WL ends, the writing time period tPROG can be reduced.

Typically, each memory cell transistor MT is configured as a single level cell (SLC) capable of storing one bit (two values) of data, a multi-level cell (MLC) capable of storing two bits (four values) of data, a TLC capable of storing three bits (eight values) of data, or a quad level cell (QLC) capable of storing four bits (16 values) of data in some cases. In particular, when each memory cell transistor MT is a TLC, a QLC, or a cell of a larger number of levels, control of the all-string read operation of the present embodiment is thought to be effective.

The above description is made on an example in which, when verify operation is omitted in the last loop of write operation, the all-string read operation using the all-string read pulse is performed before write operation ends. However, refresh read operation that provides the all-string read pulse to a different block BLK in each constant duration may be performed in a waiting state of the non-volatile memory 2 in which neither command nor the like is provided.

Figure 17:
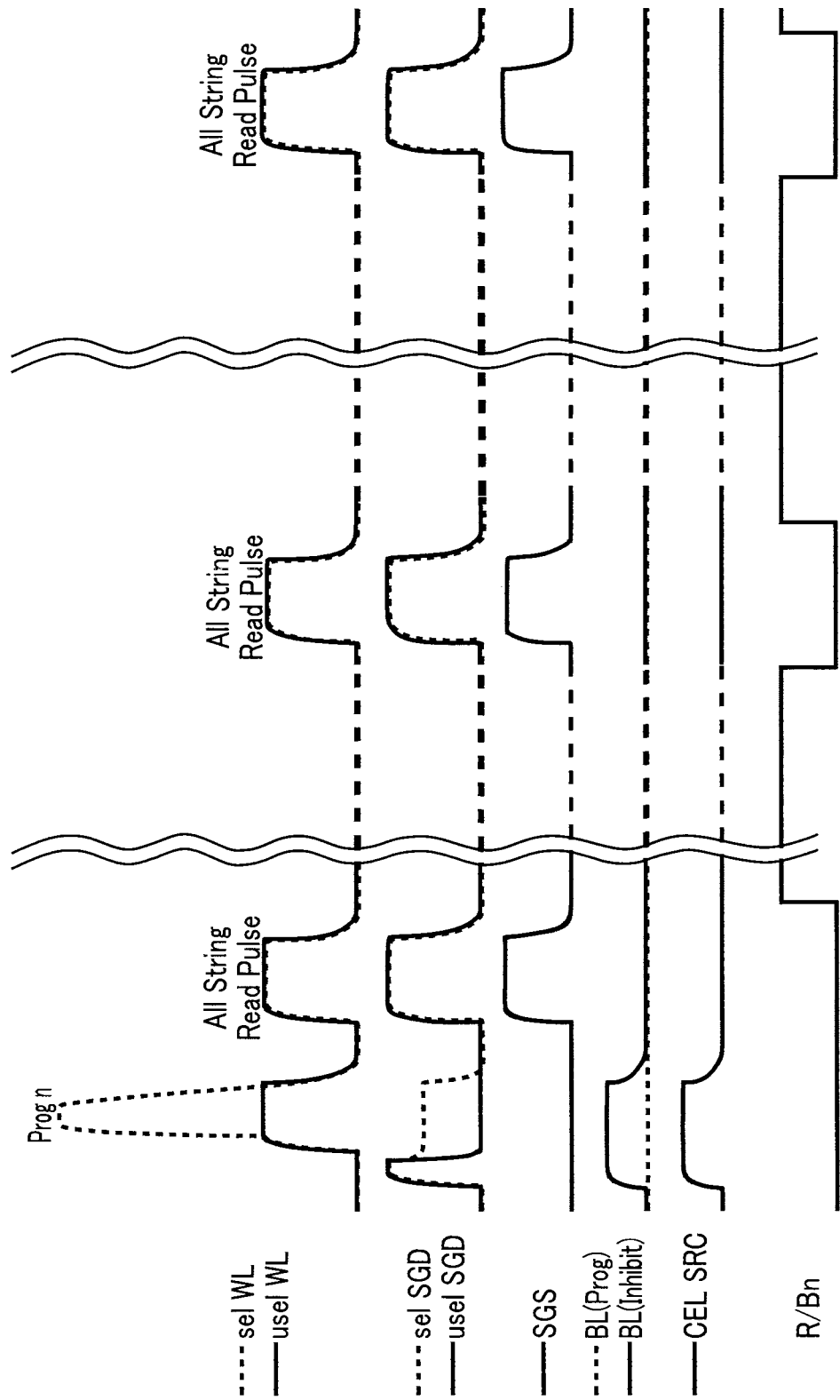
FIG. 17 is a waveform diagram illustrating waveforms of components in a refresh read operation.
Figure 18:
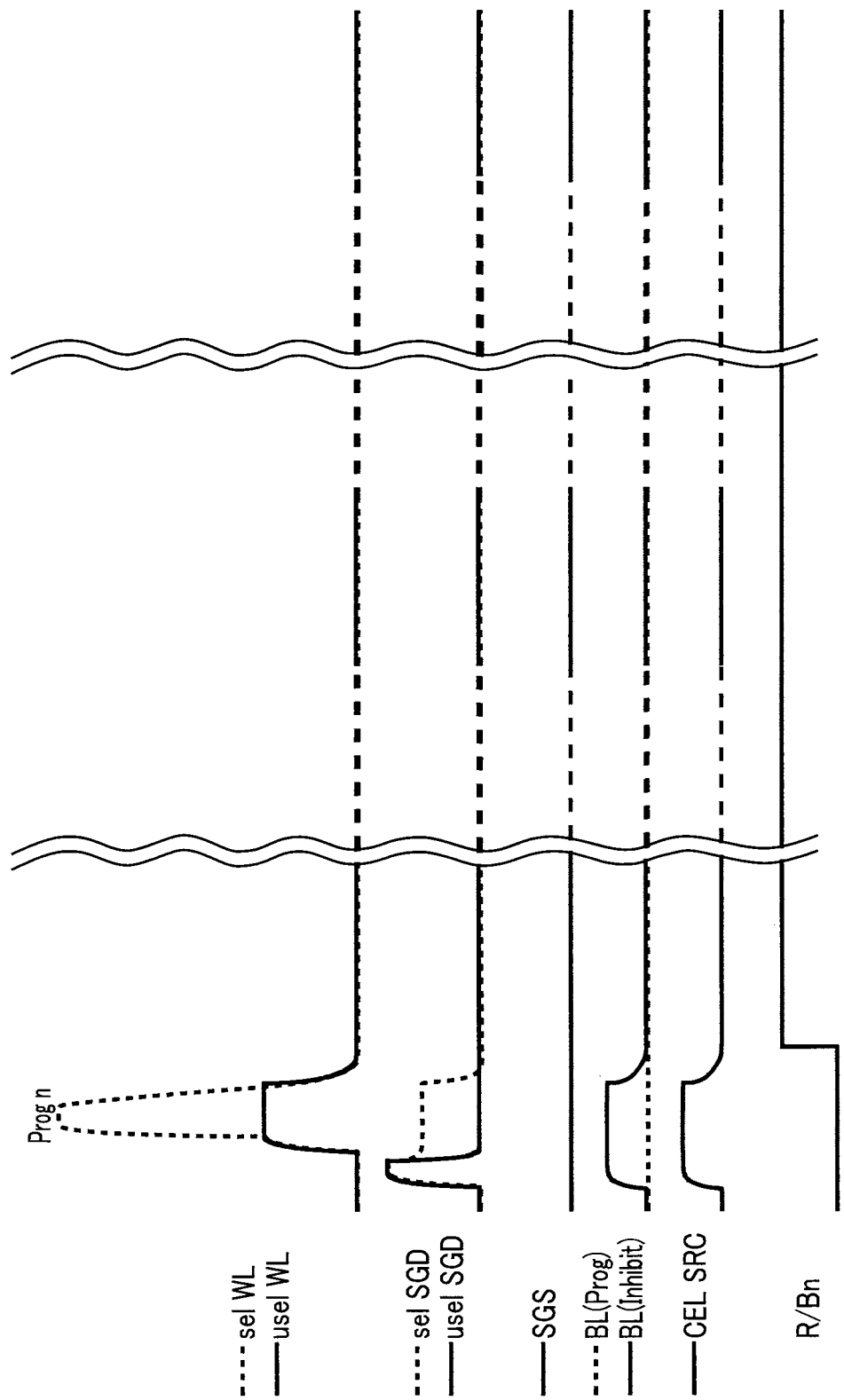
FIG. 18 is a waveform diagram illustrating waveforms of components in the refresh read operation.

FIGS. 17 and 18 are waveform diagrams illustrating waveforms of components in this case. FIG. 17 illustrates write operation for an all-string read operation target word line WL having a relatively large logic word line number LWL to which writing is completed. FIG. 18 illustrates write operation for a non all-string read operation target word line WL having a relatively small logic word line number LWL to which writing is completed. In an example of FIG. 17, the all-string read operation is performed before write operation in which verify operation is omitted in the last loop ends, and after the all-string read operation, the all-string read operation is repeated in a L level duration (busy duration) of the signal R/Bn in each constant duration. As illustrated in FIG. 18, periodic refresh read operation is omitted for a block in which writing is not performed up to a particular word line WL, and thus electric power consumption can be reduced.

A logic word line number at a boundary between an all-string read operation target and a non all-string read operation target may be same or different between before write operation ends and at refresh in waiting.

There may be a plurality of intervals between operation time periods of the refresh read operation. For example, no refresh read operation may be performed when writing is completed up to the logic word lines LWL of numbers 0-3, the refresh read operation may be performed in each constant duration t1 when writing is completed up to the logic word lines LWL of numbers 4-7, and the refresh read operation may be performed in each constant duration t2 when writing is completed up to the logic word lines LWL of numbers 8-15. For example, the constant duration t1 may be shorter than the constant duration t2.

FIG. 17 illustrates the example in which the L level duration (busy duration) of the signal R/Bn corresponds to a duration of one all-string read operation. This example is an example when the number of refresh read operation target blocks is small. When the number of refresh read operation target blocks is large, an amount of operation current that flows all at once is restricted to a certain amount or smaller by slowly performing charging and discharging simultaneously for a plurality of blocks or by performing the refresh read operation for a different block at each of a plurality of times.

In the former case, the all-string read operation as the refresh read operation requires a longer time period than the all-string read operation before write operation ends.

In the latter case, the L level duration of the signal R/Bn needs to be a time period longer than the all-string read operation for one BLK. In other words, in the waiting state of the non-volatile memory 2, the refresh read operation may be performed a plurality of times in one L level duration of the signal R/Bn.

a circuit for storing, in the register 24a of the control circuit in advance, information of a logic word line number LWL up to which writing is performed in each BLK is needed to finely perform the above-described operations for each block BLK, and chip cost increases. However, this storing circuit is unnecessary when the same control is performed for all BLK.

(Operation of All-String Read Control Circuit)

Figure 19:
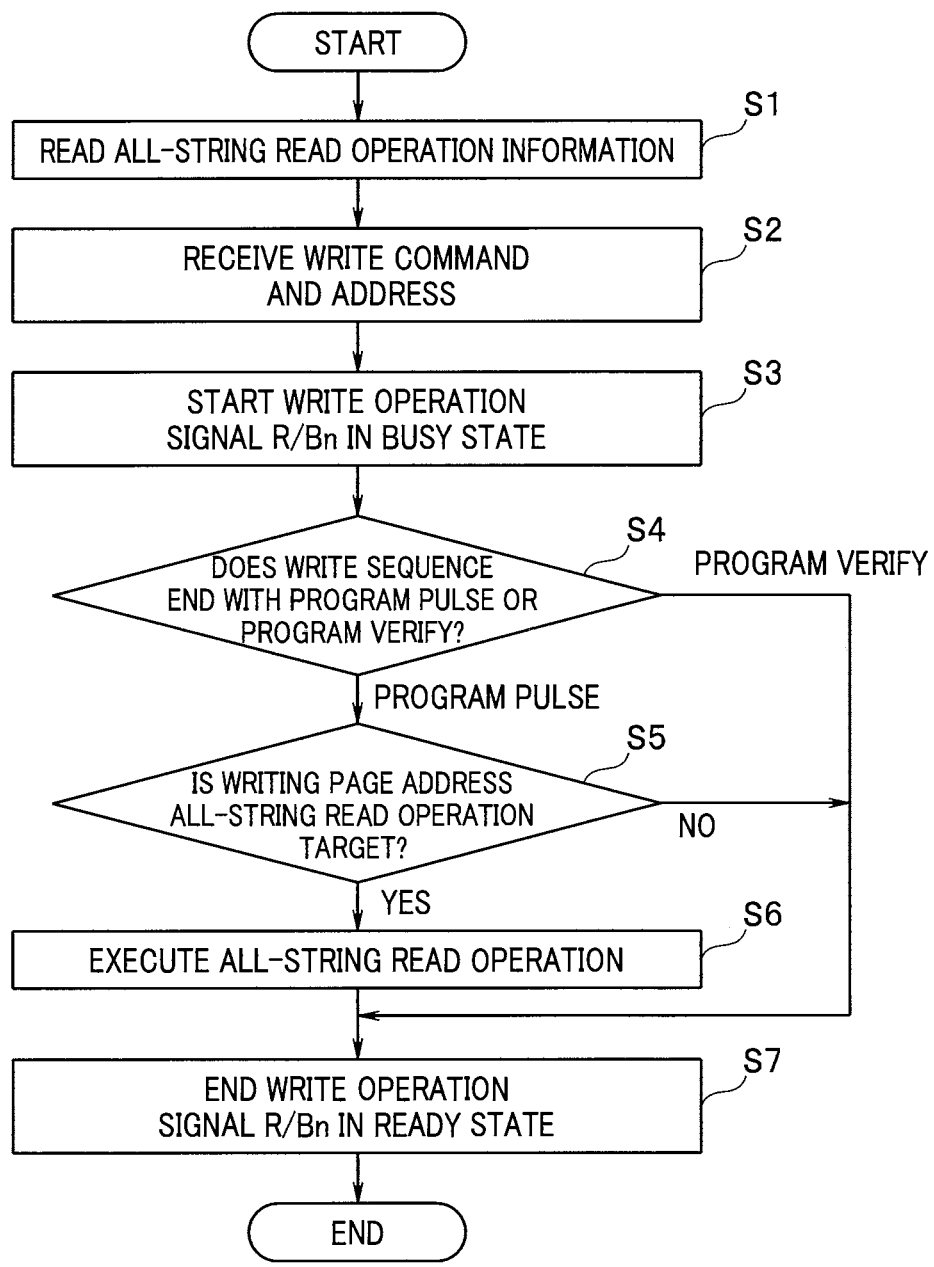
FIG. 19 is a flowchart illustrating an example of specific operation of an all-string read control circuit.

FIG. 19 is a flowchart illustrating an example of specific operation of the all-string read operation at the control circuit 24.

For example, any all-string read operation target word line can be set in advance through cell evaluation before factory shipment. Based on this setting, the all-string read operation information can be registered to the block BLKX of the memory cell array 20.

After power-on, the non-volatile memory 2 receives a command FFh for in-chip initialization. In accordance with the command FFh for in-chip initialization, at S1 in FIG. 19, the control circuit 24 reads what is called ROM information including the all-string read operation information from the block BLKX, and stores the read ROM information in various registers. The all-string read operation information is stored in, for example, the register 24a. When having received a write command and an address from the memory controller 3 (S2), the control circuit 24 starts write operation. Accordingly, the signal R/Bn becomes the busy state (S3).

FIG. 20 is a diagram for description of the address received at S2 in FIG. 19. FIG. 20 illustrates address inputting to input terminals DQ0 to DQ7 of the non-volatile memory 2 to which the signals DQ0 to DQ7, respectively, are input. A column address is input in cycles 1 and 2 among predetermined cycles 1 to 6. Note that "Don't Care" indicates indefinite bits. In cycle 3, a string unit address is input through the input terminals DQ0 and DQ1. A word line address is input through the input terminals DQ2 to DQ7 in cycle 3 and the input terminal DQ0 in cycle 4. In the present specification, a combination of a string unit address and a word line address is collectively referred to as a page address. Note that, in cycles 4 to 6, a plane address, a block address, and a chip address are acquired to the non-volatile memory 2. The input addresses are stored in the address register of the register 23.

In write operation, the control circuit 24 determines whether a write sequence ends after program pulse application to a select word line WL or ends after execution of program verify operation after program operation (S4). In other words, the control circuit 24 determines whether to execute only program operation on a select word line WL or execute the program operation and program verify operation in a final loop of the write operation (S4). When the write sequence ends after the program verify operation, the control circuit 24 ends the write operation at S7. Accordingly, the signal R/Bn becomes the ready state (S7).

When the write sequence ends after the program pulse application, at subsequent S5, the control circuit 24 determines whether a page address at which writing is performed corresponds to the all-string read operation target word line WL.

the control circuit 24 reads the word line address stored in the address register of the register 23 and controls writing and also performs the determination at S5. Specifically, the control circuit 24 determines whether an address of a select word line WL to which the program voltage VPGM is applied corresponds to an all-string read operation target word line WL designated by the all-string read operation information. When the address of the select word line WL does not correspond to the all-string read operation target word line WL, the control circuit 24 ends the write operation at S7. When the address of the select word line WL corresponds to the all-string read operation target word line WL, the control circuit 24 executes the all-string read operation (S6).

In this manner, in a NAND memory, write operation is normally executed in an order of logic word line numbers LWL in one block, and thus the number of WL for which writing is completed can be determined based on a page address and a word line address received together with a write command, and whether to execute the all-string read operation can be determined.

(Cache Program)

A write operation includes a basic program operation that sequentially performs data inputting of writing to a memory and program operation for each single page, and an operation (hereinafter referred to as a cache program operation) that sequentially and efficiently programs a plurality of pages by performing program operation and subsequent data inputting of a page to be written in parallel.

Figure 21:
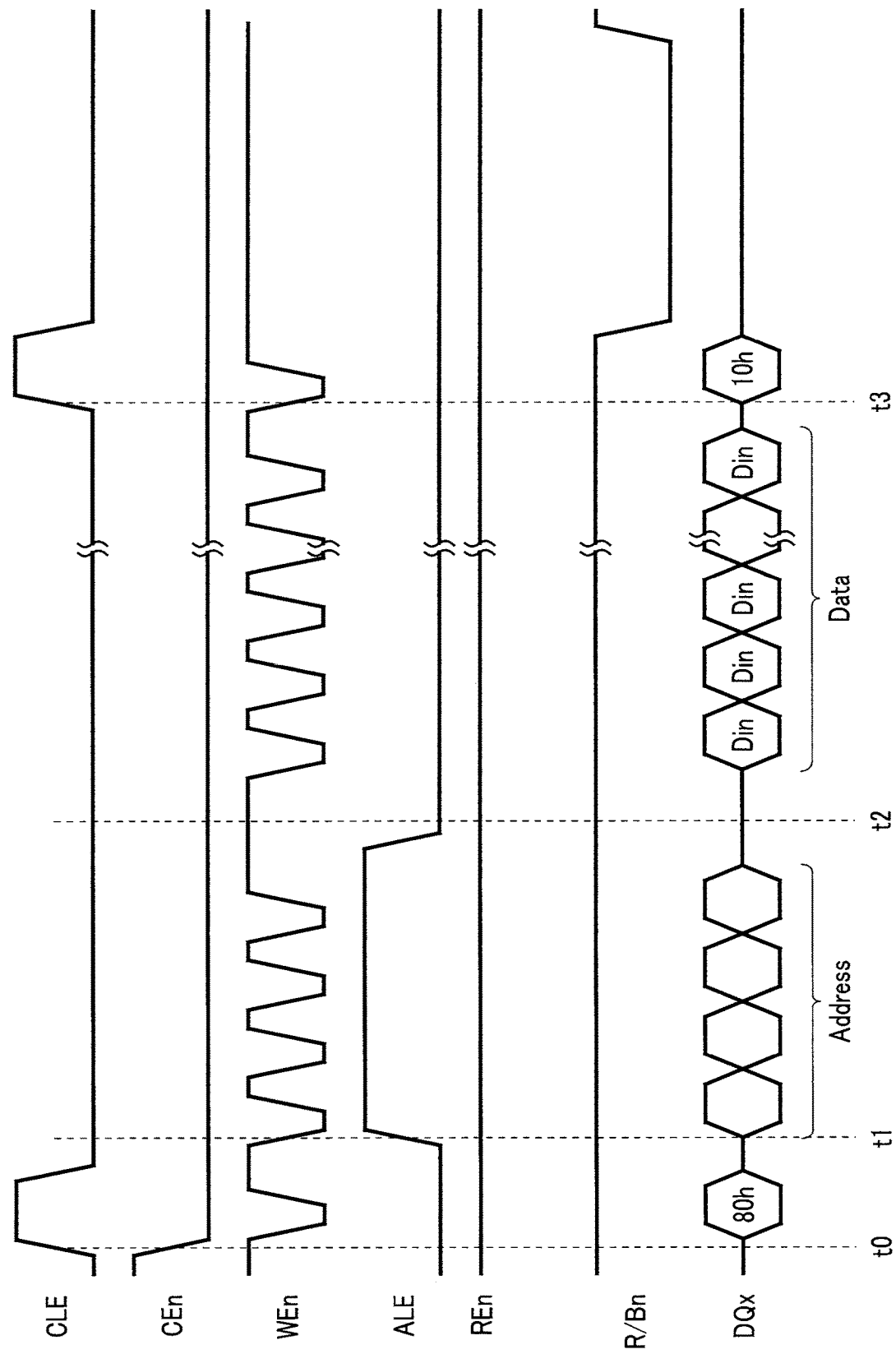
FIG. 21 is a timing chart of a basic program operation that performs program for each single page.
Figure 22:
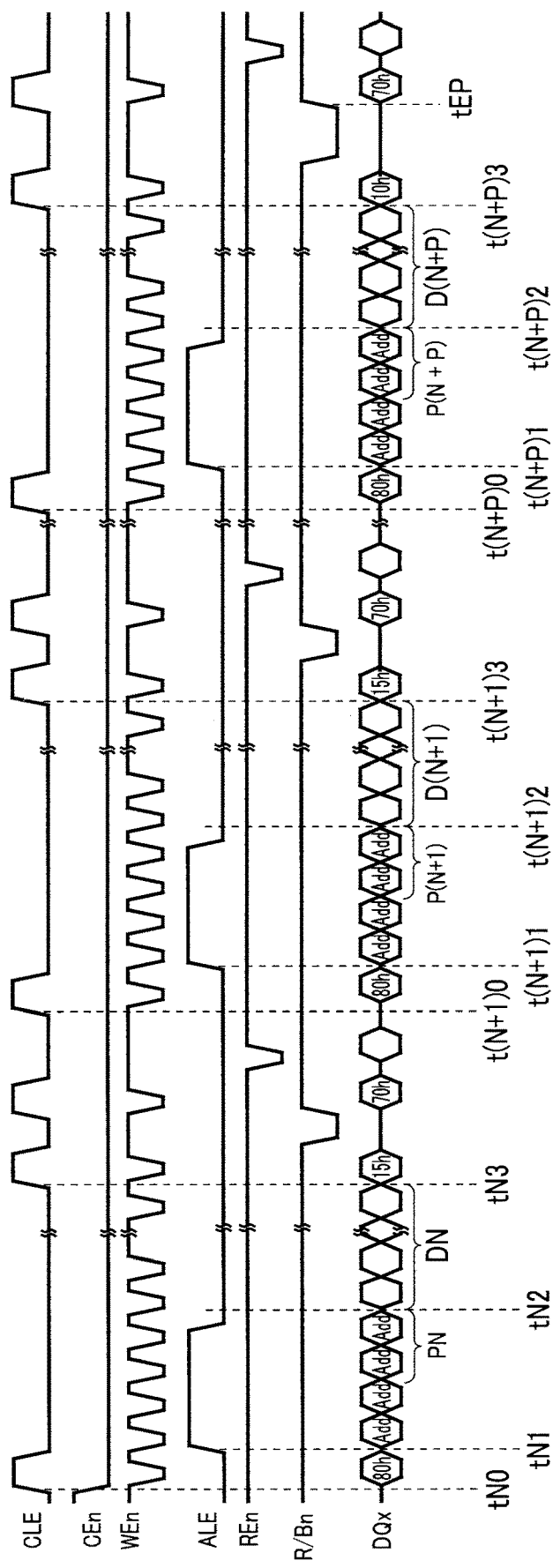
FIG. 22 is a timing chart of a cache program operation.

FIG. 21 is a timing chart illustrating the basic program operation that performs program for each single page, and FIG. 22 is a timing chart illustrating the cache program operation. FIGS. 21 and 22 illustrate the command latch enable signal CLE, the chip enable signal CEn, the writing enable signal WEn, the address latch enable signal ALE, the reading enable signal REn, the ready/busy signal R/Bn, and a signal DQx (for example, DQ0 to DQ7).

The input-output circuit 21 is controlled by the logic control circuit 22 and transmits and receives a signal DQ (for example, DQ0 to DQ7) with the memory controller 3 through a bus. When provided with the signal DQ, the input-output circuit 21 receives the signal DQ as data in synchronization with the writing enable signal WEn. In accordance with the reading enable signal REn provided to the logic control circuit 22, the input-output circuit 21 transmits data read from the memory cell array 20 to the memory controller 3 as the signal DQ.

As illustrated in FIG. 21, when the command latch enable signal CLE becomes active at time point to, the input-output circuit 21 acquires, based on a signal supplied from the logic control circuit 22, a command transmitted as the signal DQ and stores the command in the command register of the register 23. When the signal ALE becomes active at time point t1, the input-output circuit 21 acquires, based on a signal supplied from the logic control circuit 22, an address transmitted as the signal DQ and stores the address in the address register of the register 23. Note that, although the number of cycles of the address is four in FIG. 21, the number of cycles of the address may be six as illustrated in FIG. 20 or may be any other number. Following the command and the address, the input-output circuit 21 receives data (Data (Din)) in synchronization with the writing enable signal WEn at time point t2 or later. At time point t3, a command (10h) is received with the command latch enable signal CLE. This sequence of reception of the signals DQ is performed in the ready duration of the signal R/Bn.

When the signal R/Bn becomes L level (the busy state), write operation of received data is performed. The write operation is performed for each page (cell unit CU), and in an example of FIG. 21, one page of data "Data" is transmitted in a duration of time points t2 to t3 and written in the L level duration of the signal R/Bn. After the writing ends and the signal R/Bn becomes H level, the WL creep-up illustrated in FIGS. 10, 12, 14, and 15 occurs.

In this manner, in the basic program operation that performs program for each single page by the "10h" command, the all-string read operation is performed based on the all-string read operation information before write operation ends, or the all-string read operation is omitted. The signal R/Bn becomes L after "10h" inputting, maintains the L level until the all-string read operation is performed or omitted, and thereafter returns to H.

In the cache program operation, as illustrated in FIG. 22, the input-output circuit 21 acquires, based on a signal supplied from the logic control circuit 22 when the command latch enable signal CLE becomes active at time point tN0, a command transmitted as the signal DQ and stores the command in the command register of the register 23. In addition, the input-output circuit 21 acquires, based on a signal supplied from the logic control circuit 22 when the signal ALE becomes active at time point tN1, an address (Add) transmitted as the signal DQ and stores the address in the address register of the register 23. For example, an address in a second half of the address (Add) is a page address (PN) of a page PN. Following the command and the address, the input-output circuit 21 receives, in synchronization with the writing enable signal WEn, data (hereinafter referred to as data DN) written to the page PN at time point tN2 or later.

The data DN is cached from the input-output circuit 21 to the data latch circuit XDL in the data register 29 through the register 23, and thereafter writing data of XDL is forwarded to ADL/BDL/CDL so that XDL is released again and becomes ready for data inputting. This process is repeated. At time point tN3, when a command (15h) is received with the command latch enable signal CLE, program of the cached data is started. This sequence of reception of the signals DQ is performed in the ready duration of the signal R/Bn.

A page address (P(N+1)) is received at time points t(N+1)1 to t(N+1)2, and data D(N+1) to be written to the page address (P(N+1)) is received at time points t(N+1)2 to t(N+1)3. Thereafter, similarly, a page address (P(N+P)) is received at time points t(N+P)1 to t(N+P)2, and data D(N+P) to be written to the page address (P(N+P)) is received at time points t(N+P)2 to t(N+P)3.

The data DN received in a duration of time points tN2 to tN3 is forwarded from the data latch circuit XDL to a data latch circuit (any of ADL, BDL, and CDL) in the corresponding sense amplifier unit SAU in the busy duration of the signal R/Bn by a command (15h) received after time point tN3. When the forwarding is completed, the data latch circuit XDL becomes empty and the signal R/Bn transitions from the busy state to the ready state. When the signal R/Bn becomes the ready state, the non-volatile memory 2 can receive a command, an address, and data (N+1) of a next write operation from the memory controller 3. Typically, write operation including a plurality of loops each including at least program operation of the data DN is executed in parallel to reception of the next data D(N+1). Similarly, write operation of the data D(N+1) is executed in parallel to reception of data D(N+2). A command (10h) received after time point t(N+P)3 indicates that data D(N+P) starts program of data of a last page in the cache program operation. Write operation of the data D(N+P) is executed after write operation of data D(N+P−1), the program of the data D(N+P) ends by time point tEP, and the signal R/Bn becomes the ready duration. Note that, information of the non-volatile memory 2, such as success or failure of write operation is output by a read status command 70 h.

In the cache program operation that performs program for each continuous page, write operation ends at a last continuous page. At a page halfway through the continuous pages, a time period until writing of a next page is short and a duration in which no bias is applied to word lines is extremely short, and thus the all-string read operation is omitted. In operation that performs program for each continuous page, the all-string read operation is performed based on the all-string read operation information before write operation for each continuous page ends (right before time point tEP), or the all-string read operation is omitted.

In the all-string read operation, the all-string read pulse is applied for each block, and thus the all-string read operation needs to be performed once for each block in a case of the cache program operation in which writing is performed for continuous pages.

An example of writing in the cache program operation will be described below with reference to explanatory diagrams of FIGS. 23 to 27. FIGS. 23 to 27 illustrate the signal R/Bn, illustrate command, data and address inputting examples above the signal R/Bn, and illustrate durations of page data writing and the all-string read operation below the signal R/Bn. In FIGS. 23 to 27, Prog N denotes writing of a page N, and Prog M denotes writing of a page M.

Figure 23:
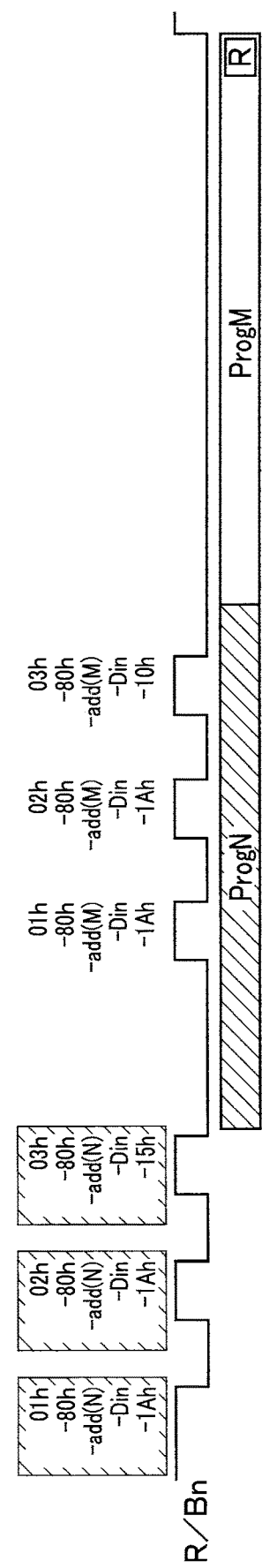
FIG. 23 is an explanatory diagram illustrating an example of writing in the cache program operation.
Figure 24:
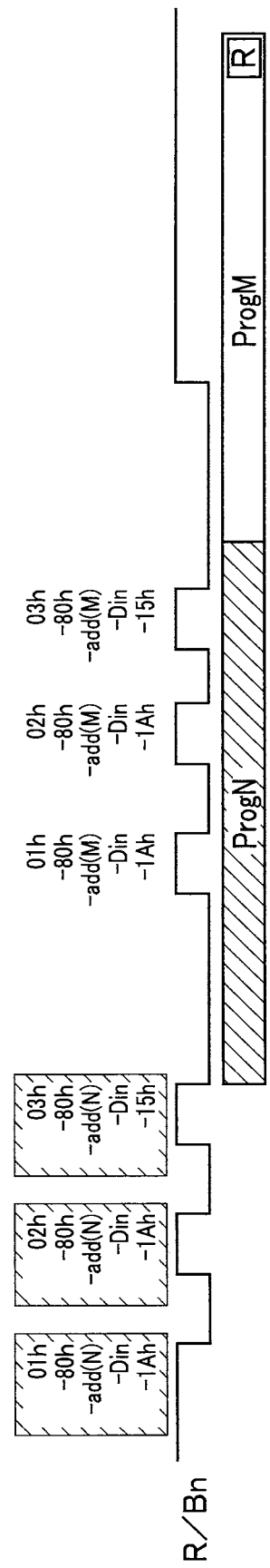
FIG. 24 is an explanatory diagram illustrating an example of writing in the cache program operation.
Figure 25:
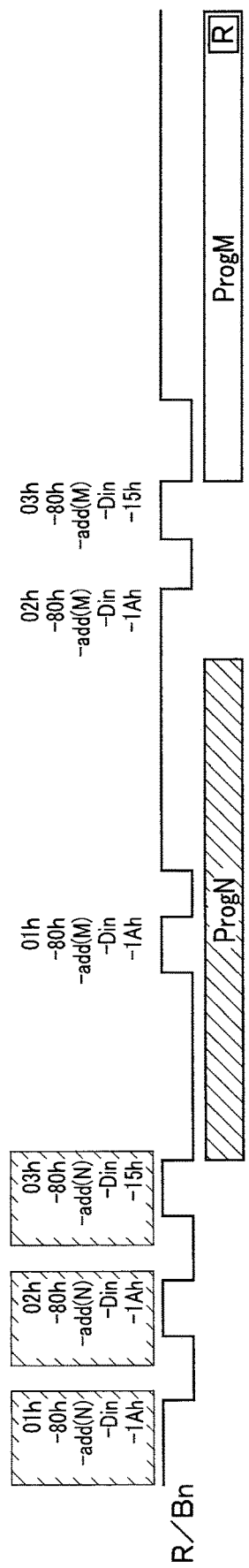
FIG. 25 is an explanatory diagram illustrating an example of writing in the cache program operation.

In examples in FIGS. 23 to 25, two pieces of page data to be programmed by cache program are written to the same block BLK. FIGS. 23 to 27 illustrate examples in which page data is divided into the three pages of a Lower page, a Middle page, and an Upper page and transmitted. In FIGS. 23 to 27, 01h, 02h, and 03h represent the Lower page, the Middle page, and the Upper page, respectively, 80h represents a write command, add(N) and add(M) represent addresses, Din represents data, 1Ah, 10h, and 15h represent commands, and R represents execution of the all-string read operation.

In the example of FIG. 23, data of the Lower page, the Middle page, and the Upper page, which is input through a command sequence in a hatched cell is indicated for data of the page N, and data of the Lower page, the Middle page, and the Upper page, which is input through a command sequence in a non-hatched cell is indicated for data of the page M. The data of the page N is cached by the data latch circuit XDL and forwarded to any of the data latch circuits ADL, BDL, and CDL and written in a duration denoted by Prog N. In the program Prog N duration, operation is repeated in which data of the Lower, Middle, and Upper pages of the page M is cached by the data latch circuit XDL and sequentially forwarded to ADL/BDL/CDL, which are sequentially released in accordance with writing completion at each writing state, so that XDL is released again and becomes ready for data inputting.

In FIG. 23, add(N) and add(M) include an address of the same block BLK, and the data of the page N and the data of the page M are written to the same block BLK. At a time point when program Prog N of the data of the page N ends, the data of the page M is already cached and has program reservation. The block BLK to which the data of the page N is written and the block BLK to which the data of the page M is written are same. Thus, the all-string read operation is omitted at the time point when program Prog N of the data of the page N ends.

Program of last page data in the cache program operation is instructed by a command 10h, and thus the all-string read operation is performed when program Prog M of the data of the page M ends.

In this manner, in cache program by a 15h command, even at a timing at which the all-string read operation is to be executed based on the all-string read operation information, the all-string read operation is omitted when page data to be programmed next is cached and has program reservation and an address to which the page data to be programmed next is written and an address of previously written page data are addresses in the same block BLK. The signal R/Bn becomes L after 15h inputting but is controlled to return to H at a time point when the data register 29 is released (when the data DN is forwarded from the data register 29 to the sense amplifier unit group 28), and it is possible to perform data inputting and memory cell writing in parallel and improve system performance.

In the example of FIG. 24, the page M is a page (halfway page) before a last page in cache program. In this case as well, when program of a page to be written next to the page M is not reserved, the all-string read operation is not omitted at end of program Prog M. As illustrated in FIG. 24, in program Prog N of the data of the page N, since the data of the page M is cached and has program reservation, the all-string read operation is omitted before program Prog N of the data of the page N ends. However, in a Prog M duration in which the data of the page M is programmed by a command 15h, no page data next to the data of the page M is cached and has program reservation. Thus, the all-string read operation is performed before program Prog M of the data of the page M ends.

In the example of FIG. 25, it is understood based on designation of an address of the Lower page data of the page M that an address to which the data of the page M is written and an address to which the data of the page N before the data of the page M is written are addresses in the same block BLK. In this case, in program Prog N of the data of the page N, the all-string read operation before program Prog N ends is omitted even when not all data of the next page M is cached. Note that program of the data of the page M is executed in accordance with a command 15h after all data of the page M is cached. No next page data is reserved in a duration of program Prog M, and thus the all-string read operation is performed before program Prog M ends.

Figure 26:
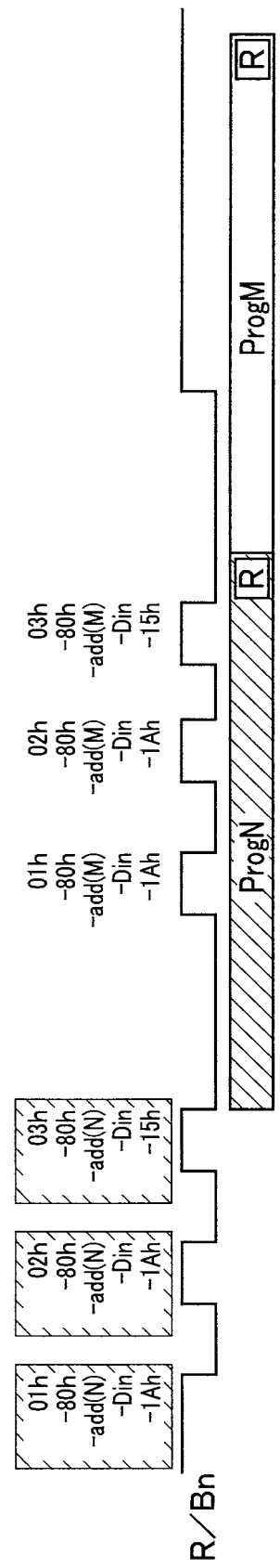
FIG. 26 is an explanatory diagram illustrating an example of writing in the cache program operation.
Figure 27:
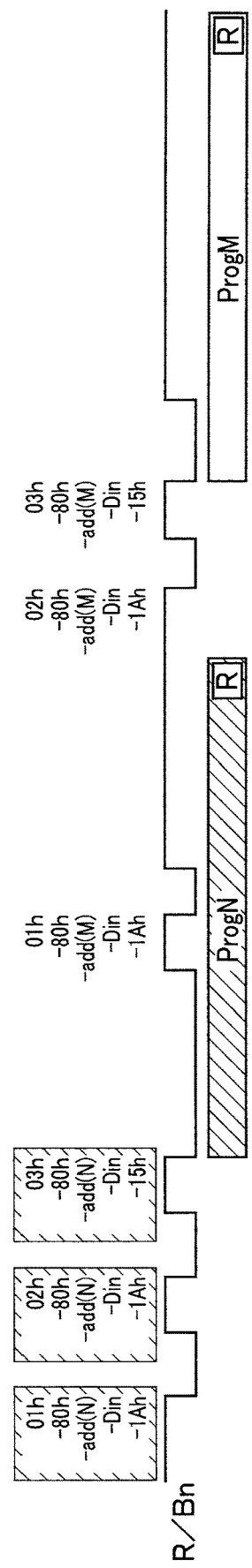
FIG. 27 is an explanatory diagram illustrating an example of writing in the cache program operation.

In the examples illustrated in FIGS. 26 and 27, two pieces of page data to be programmed by cache program are written to blocks BLK different from each other. Specifically, in FIGS. 26 and 27, add(N) and add(M) have addresses of different blocks BLK, and the data of the page N and the data of the page M are written to the different blocks BLK, respectively.

As understood from comparison between FIGS. 26 and 24, in the example of FIG. 26, write commands and the page data N and M are input at timings same as in FIG. 24. In the example of FIG. 26, the block address add(N) to which the data of the page N is written and the block address add(M) to which the data of the page M is written are different from each other. In this case, as illustrated in FIG. 26, the all-string read operation is performed before program Prog N ends. The other operation is same as in FIG. 24.

As understood from comparison between FIGS. 27 and 25, in the example of FIG. 27, write commands and the page data N and M are input at timings same as in FIG. 25. In the example of FIG. 27, the block address add(N) to which the N page data is written and the block address add(M) to which the M page data is written are different from each other. In this case, as illustrated in FIG. 27, the all-string read operation is performed before program Prog N ends. The other operation is same as in FIG. 25.

In this manner, the all-string read operation is performed for each block. Thus, when writing is performed in one block, the all-string read operation needs to be performed once for the block in which the writing is performed. Accordingly, in cache program, the all-string read operation before program of page data ends halfway through cache program is omitted for the same block, and the all-string read operation is performed before program of last page data ends. Accordingly, the time period tPROG taken for writing can be shortened.

Second Embodiment

Figure 28:
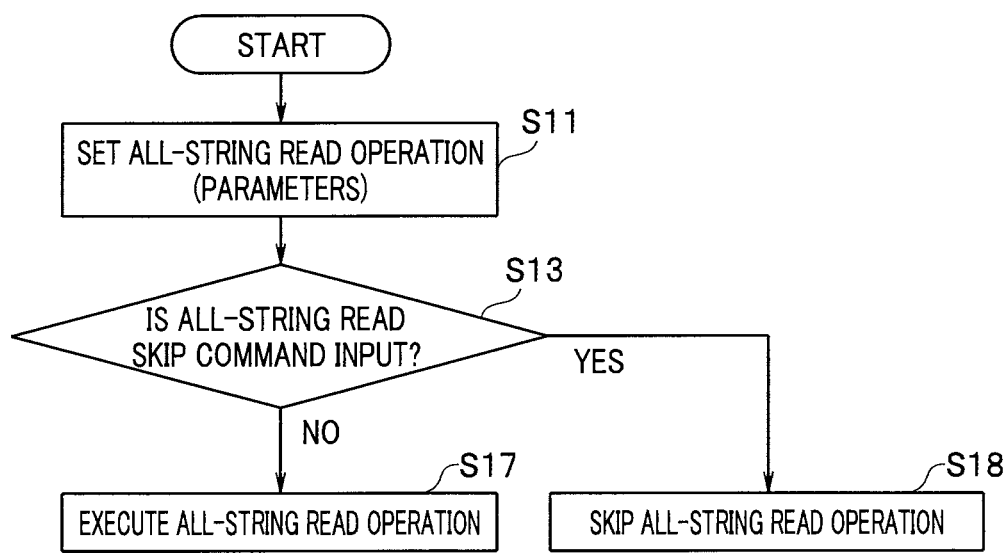
FIG. 28 is a flowchart for description of a second embodiment.
Figure 29:
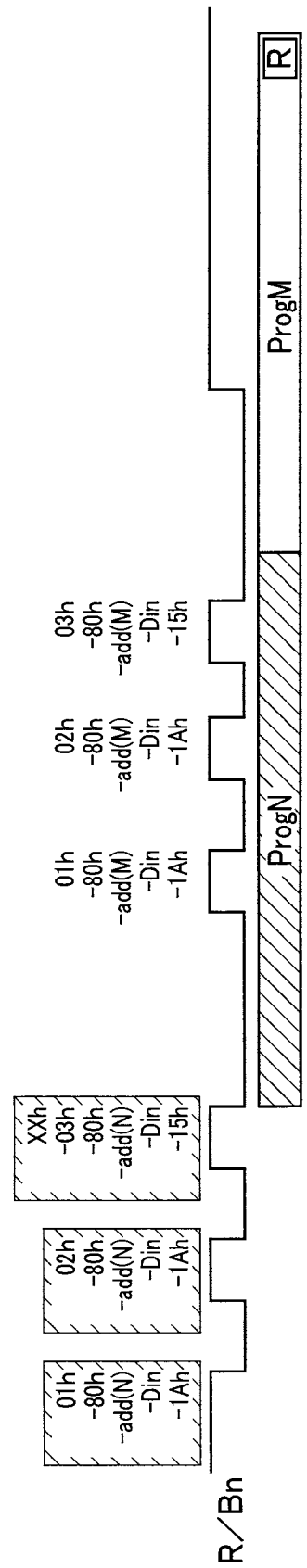
FIG. 29 is an explanatory diagram for description of the second embodiment.
Figure 30:
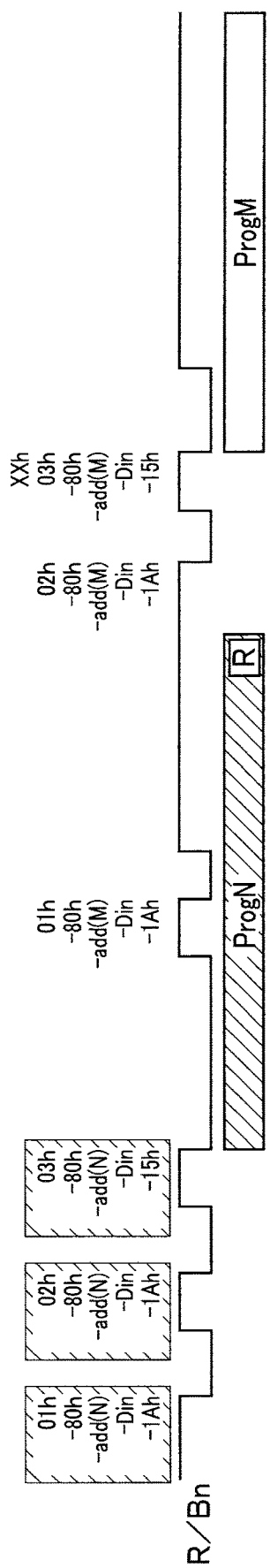
FIG. 30 is an explanatory diagram for description of the second embodiment.
Figure 31:
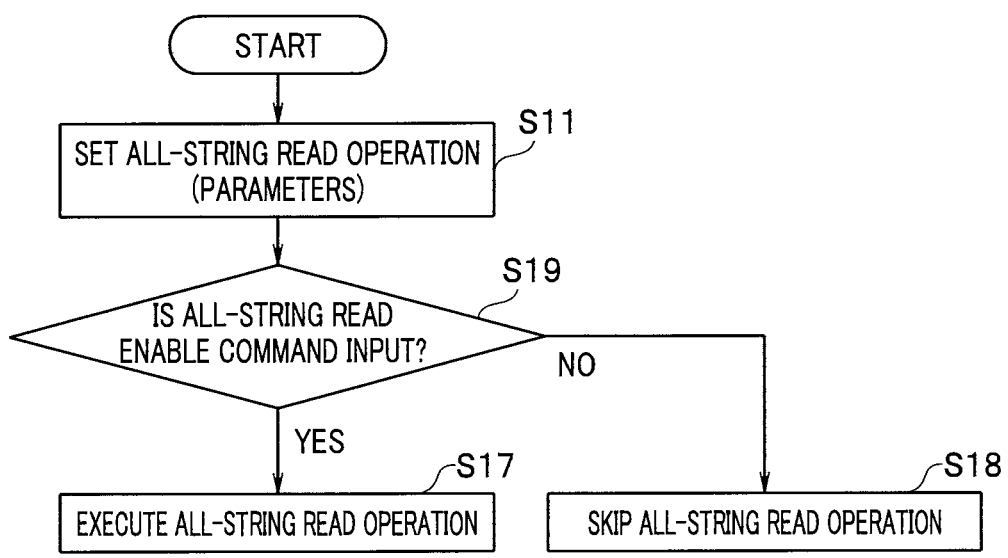
FIG. 31 is a flowchart for description of the second embodiment.

FIGS. 28 to 31 relate to a second embodiment, FIGS. 28 and 31 are flowcharts for description of the second embodiment, and FIGS. 29 and 30 are explanatory diagrams for description of the second embodiment with notation same as in FIGS. 23 to 27. In FIGS. 28 and 31, identical procedures are denoted by the same reference sign, and duplicate description is omitted.

The first embodiment describes above the example in which, in the non-volatile memory 2, the control circuit 24 controls the all-string read operation based on the all-string read operation information registered in advance. According to the present embodiment, the non-volatile memory 2 can control the all-string read operation by receiving a command related to control of the all-string read operation from the memory controller 3.

At S11 in FIG. 28, setting of the all-string read operation (parameter setting) is performed. Note that the parameter setting is performed, for example, before factory shipment of the non-volatile memory 2. For example, at factory shipment, an F_ASTRREAD_PROGEN_TLC parameter (hereinafter referred to as an all-string read operation execution parameter) may be set as a parameter that determines whether to execute the all-string read operation. When the all-string read operation execution parameter is "1", the control circuit 24 basically executes the all-string read operation based on the all-string read operation information. When the all-string read operation execution parameter is "0", the control circuit 24 basically does not execute the all-string read operation.

A user supplied with the non-volatile memory 2 understands the parameter setting of the all-string read operation and can output a command corresponding to desired control of the all-string read operation from the memory controller 3.

Commands that can be supplied from the memory controller 3 are, for example, an all-string read skip command and an all-string read enable command. The all-string read skip command is a command for omitting the all-string read operation, and the all-string read enable command is a command for executing the all-string read operation. For example, a common execution control command XXh may be employed as the all-string read skip command and the all-string read enable command.

For example, the memory controller 3 may provide command sequences described in (1) and (2) below to the non-volatile memory 2. Note that meanings of the command sequences are same as in FIGS. 23 to 27 described above and designate program of data of the Upper page to an address. The command sequence in (2) includes the execution control command XXh appended to the command sequence in (1). Specifically, the memory controller 3 can control the all-string read operation by adding the execution control command XXh to a command sequence necessary for program.

03h-80h-add-Din-10/15h    (1)

XXh-03h-80h-Add-Din-10/15h    (2)

FIGS. 29 and 30 illustrate examples when the all-string read operation execution parameter is "1". Specifically, in this case, the control circuit 24 basically executes the all-string read operation. The control circuit 24 determines whether the execution control command XXh as the all-string read skip command is input from the memory controller 3 (S13). In a case of data inputting of (1), since the execution control command XXh is not input, the control circuit 24 executes the all-string read operation at S17. However, in a case of data inputting of (2), since the execution control command XXh as the all-string read skip command is input, the control circuit 24 executes program in which the all-string read operation is omitted at S18.

In FIG. 29, data of the page N input in a duration before a duration of program Prog N additionally includes the execution control command XXh as the all-string read skip command. Thus, in accordance with "YES" determination at S13, the control circuit 24 omits the all-string read operation when program Prog N ends (S18). Data of the page M input in the duration of program Prog N in FIG. 29 does not additionally include the execution control command XXh as the all-string read skip command. Thus, in accordance with "NO" determination at S13, the control circuit 24 executes the all-string read operation when program Prog N ends (S17).

In FIG. 30, N page data input in a duration before the duration of program Prog N does not additionally include the execution control command XXh as the all-string read skip command. Thus, in accordance with "NO" determination at S13, the control circuit 24 executes the all-string read operation when program Prog N ends (S17). In addition, M page data input before the duration of program Prog M in FIG. 30 additionally includes the execution control command XXh as the all-string read skip command. Thus, in accordance with "YES" determination at S13, the control circuit 24 omits the all-string read operation when program Prog N ends (S18).

FIG. 31 illustrates an example in which the all-string read operation execution parameter is "0", and the control circuit 24 basically omits the all-string read operation. In this case, as illustrated in FIG. 31, the all-string read enable command is input as the execution control command XXh. When the execution control command XXh as the all-string read enable command is input ("YES" determination at S19), the all-string read operation when program ends is executed (S17). When the execution control command XXh as the all-string read enable command is not input ("NO" determination at S19), the all-string read operation when program ends is omitted (S18).

In this manner, in the present embodiment, the all-string read operation of the non-volatile memory 2 can be controlled by the execution control command XXh from the memory controller 3. For example, the memory controller 3 may perform verify read to check whether program is correctly performed after the program. In this case, the 2nd read state can be maintained by read after program, and thus the all-string read operation is preferably omitted. For example, the memory controller 3 outputs a command and explicitly instructs the all-string read operation in some cases. When such a command is used, as well, the all-string read operation is preferably omitted in some cases. In the present embodiment, the all-string read operation can be controlled by the memory controller 3 in these cases as well.

Third Embodiment

Figure 32:
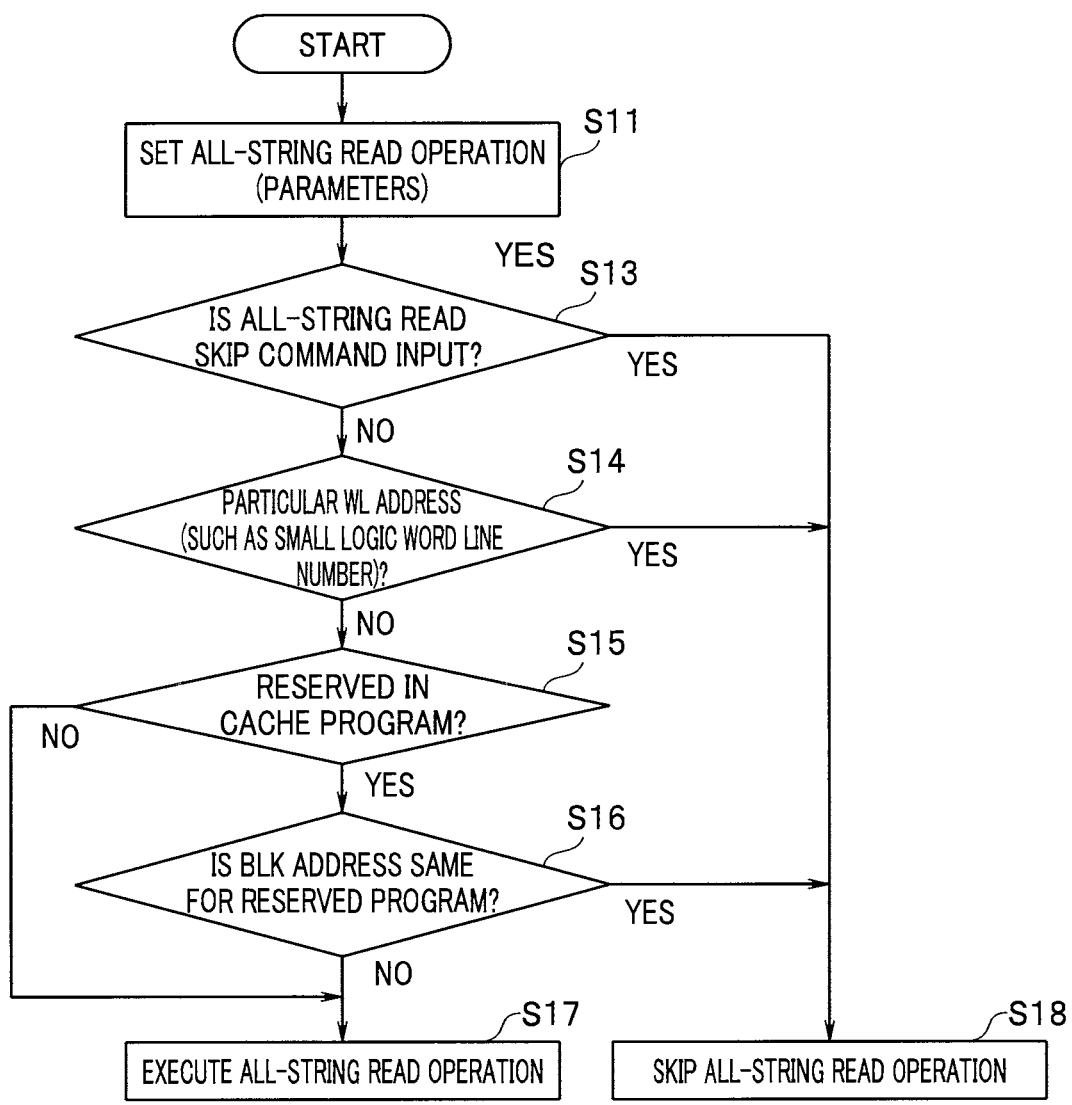
FIG. 32 is a flowchart for description of a third embodiment.
Figure 33:
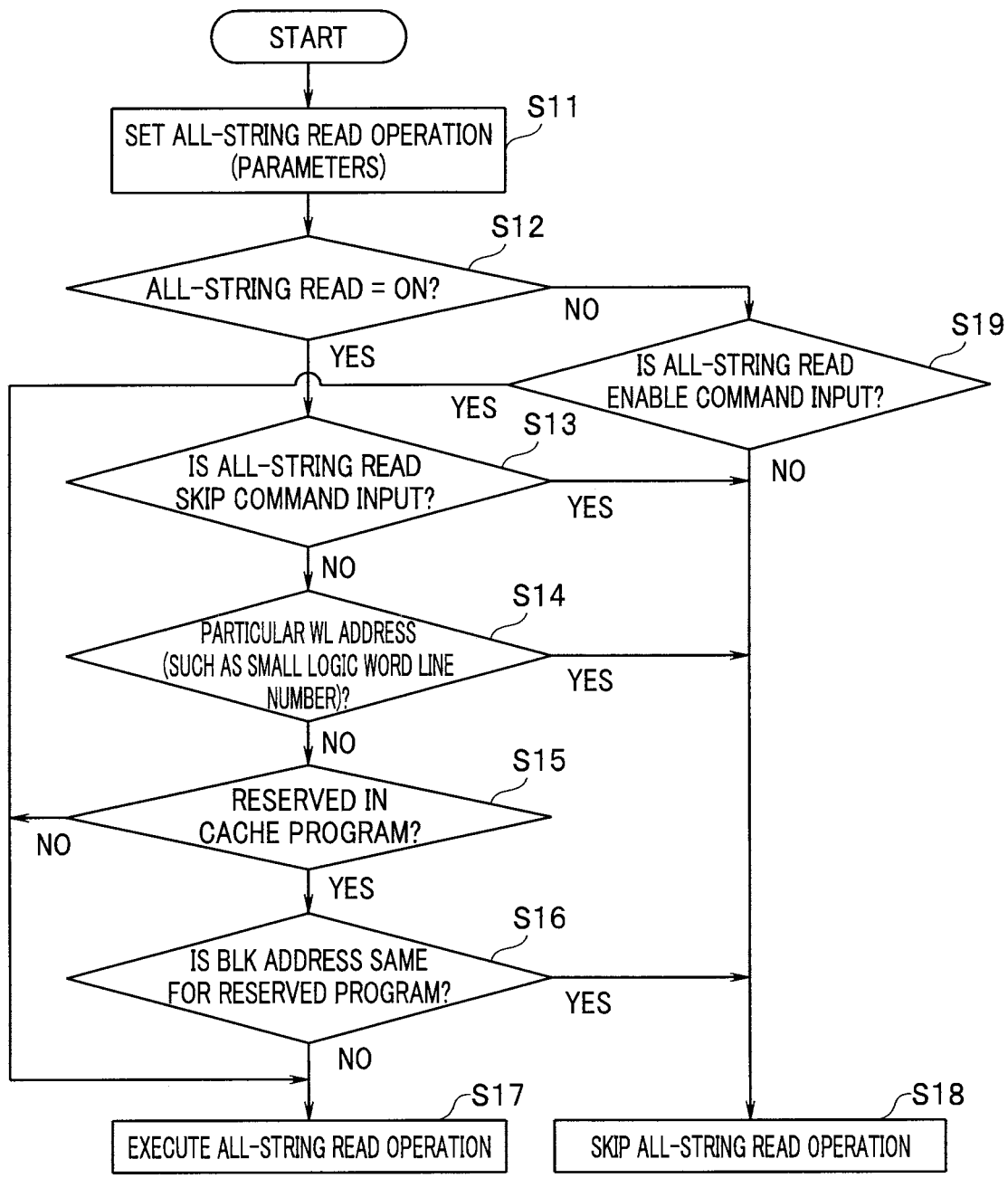
FIG. 33 is a flowchart for description of the third embodiment.

FIGS. 32 and 33 are flowcharts for description of a third embodiment. In FIGS. 32 and 33, identical procedures or a procedure identical to a procedure in FIGS. 28 and 31 is denoted by the same reference sign, and duplicate description is omitted. In the present embodiment, controls in the first and second embodiments are combined. Note that, in an example of FIG. 32, it is assumed that the all-string read operation execution parameter is "1", and the control circuit 24 basically executes the all-string read operation. In an example of FIG. 33, the all-string read operation can be controlled irrespective of the all-string read operation execution parameter.

In FIGS. 32 and 33, setting of the all-string read operation (parameter setting) is performed at S11, for example, before factory shipment of the non-volatile memory 2. In the third embodiment, in the parameter setting, the all-string read operation information is written to the block BLKX, and the all-string read operation execution parameter is set as a parameter that determines whether to execute the all-string read operation based on the all-string read operation information or the like.

In the example of FIG. 32, a user supplied with the non-volatile memory 2 understands the parameter setting of the all-string read operation and can output a command corresponding to desired control of the all-string read operation from the memory controller 3. In other words, in the example of FIG. 32, the memory controller 3 outputs the all-string read skip command as the execution control command XXh.

In the example of FIG. 32, the all-string read operation execution parameter is "1" and the control circuit 24 basically executes the all-string read operation. At S13 in FIG. 32, the control circuit 24 determines whether the execution control command XXh as the all-string read skip command is input.

In a case of the above-described data inputting of (1), since the execution control command XXh is not input ("NO" determination at S13), at subsequent S14, the control circuit 24 determines whether program uses a particular word line WL defined in the all-string read operation information, for example, a word line WL of a small logic word line number. When program does not use a particular word line WL ("NO" determination at S14), at subsequent S15, the control circuit 24 determines whether program is reserved in cache program. When program is not reserved in cache program ("NO" determination at S15), the control circuit 24 executes the all-string read operation (S17).

In a case of the above-described data inputting of (2), the execution control command XXh is additionally provided. Thus, in accordance with "YES" determination at S13, the control circuit 24 omits the all-string read operation when program ends (S18).

Note that the all-string read operation is omitted (S18) when the execution control command XXh is not input but program uses particular word line WL ("YES" determination at S14) and when program is reserved in cache program and a block BLK address to which program before the reserved program is written and a block BLK address to which the reserved program is written are same (reserved program and BLK address are same) ("YES" determination at S16).

In the example of FIG. 33, at S12, the control circuit 24 determines whether the all-string read operation execution parameter is "1" (all-string read=ON) ("YES" determination at S12) or "0" ("NO" determination at S12). In a case of "YES" determination at S12, the control circuit 24 determines whether the execution control command XXh as the all-string read skip command is input at S13. In a case of "NO" determination at S12, the control circuit 24 determines whether the execution control command XXh as the all-string read enable command is input at S19. The other procedure is same as in FIG. 32.

In this manner, in the present embodiment, effects of the first and second embodiments can be achieved in combination, and the all-string read operation can be controlled by the memory controller 3 and the non-volatile memory 2.

Notes

Note 1
A semiconductor storage device including:
a plurality of memory strings each including a plurality of memory cell transistors connected in series, the plurality of memory strings being connected in parallel to one another;
a plurality of word lines connected to gates of the plurality of memory cell transistors;
a block including the plurality of memory strings connected to the plurality of word lines in common; and
a control circuit, wherein
the plurality of word lines include a first word line and a second word line different from the first word line,
the plurality of memory cell transistors include a first memory cell transistor and a second memory cell transistor, the first memory cell transistor being connected to the first word line, the second memory cell transistor being connected to the second word line,
the control circuit controls a first write operation and a second write operation, the first write operation being performed on the first memory cell transistor, the second write operation being performed on the second memory cell transistor after the first write operation,
in a first predetermined duration that follows end of the first write operation and in which no command is input, a ready/busy signal maintains a ready state,
in a second predetermined duration that follows end of the second write operation and in which no command is input, the ready/busy signal becomes the ready state and then becomes a busy state, and
a duration of the first predetermined duration is the same as a duration of the second predetermined duration.

Note 2
A semiconductor storage device including:
a plurality of memory strings each including a plurality of memory cell transistors connected in series, the plurality of memory strings being connected in parallel to one another;
a plurality of word lines connected to gates of the plurality of memory cell transistors;
a block including the plurality of memory strings connected to the plurality of word lines in common; and
a control circuit, wherein
the plurality of word lines include a first word line and a second word line different from the first word line,
the plurality of memory cell transistors include a first memory cell transistor and a second memory cell transistor, the first memory cell transistor being connected to the first word line, the second memory cell transistor being connected to the second word line,
the control circuit controls a first write operation and a second write operation, the first write operation being performed on the first memory cell transistor, the second write operation being performed on the second memory cell transistor after the first write operation,
the first and second write operations include a plurality of loops each including at least a program operation,
a last loop in the first write operation performs the program operation and does not perform a first voltage application operation that applies predetermined voltage to the first and second word lines, and
a last loop in the second write operation performs the program operation and the first voltage application operation.

Note 3
The semiconductor storage device according to Note 2, further including:
a plurality of bit lines connected to the plurality of memory strings, respectively; and
a first transistor connected to one of the plurality of bit lines, wherein the first and second write operations include a plurality of loops each including at least program operation,
in a last loop in the first write operation, a first voltage is applied to a gate of the first transistor,
in a previous loop of the last loop in the second write operation, the first voltage is applied to the gate of the first transistor and a second voltage lower than the first voltage is applied after the first voltage is applied, in the last loop in the second write operation, the first voltage is applied to the gate of the first transistor and a third voltage lower than the first voltage is applied after the first voltage is applied, and a time period in which the second voltage is applied is longer than a time period in which the third voltage is applied.

Note 4

The semiconductor storage device according to Note 3, wherein the third voltage is equal to or lower than the second voltage.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor storage device comprising:
a plurality of memory strings each including a plurality of memory cell transistors connected in series, the plurality of memory strings being connected in parallel to one another;
a plurality of word lines connected to gates of the plurality of memory cell transistors;
a block including the plurality of memory strings connected to the plurality of word lines in common; and
a control circuit configured to control a write operation on at least part of the plurality of memory cell transistors, wherein
the semiconductor storage device is configured to receive a write command and an address and perform data writing,
the write operation is executed in response to reception of the write command and the address,
the control circuit is configured to perform a first voltage application operation before the write operation ends, if the address corresponds to a predetermined target word line,
the control circuit is configured not to perform the first voltage application operation before the write operation ends, if the address does not correspond to a predetermined target word line, and
the first voltage application operation applies a predetermined voltage to the plurality of word lines.

2. The semiconductor storage device according to claim 1, wherein
the address includes a page address, and
the control circuit determines, based on the page address, whether to perform the first voltage application operation before the write operation ends.

3. The semiconductor storage device according to claim 1, wherein
the address includes a word line address, and
the control circuit determines, based on the word line address, whether to perform the first voltage application operation before the write operation ends.

4. The semiconductor storage device according to claim 1, wherein a value of the predetermined voltage is higher than a value of a highest reading voltage.

5. The semiconductor storage device according to claim 1, wherein a value of the predetermined voltage is substantially equal to a value of a voltage that causes conduction to any non-selected memory cell transistor among the plurality of memory cell transistors in a read operation on a selected memory cell transistor among the plurality of memory cell transistors.

6. The semiconductor storage device according to claim 1, further comprising:
a bit line connected to one of the plurality of memory strings; and
a sense amplifier connected to the bit line through a first transistor,
wherein an off-voltage is applied to the first transistor during the first voltage application operation.

7. The semiconductor storage device according to claim 1, further comprising:
a bit line connected to one of the plurality of memory strings;
a sense amplifier connected to the bit line through a first transistor;
a second transistor included in the sense amplifier, connected to the first transistor on one side, and connected to a first power voltage on another side; and
a third transistor included in the sense amplifier, connected to the first and second transistors on one side, and connected to a second power voltage lower than the first power voltage on another side,
wherein, during the first voltage application operation, an on-voltage is applied to the first transistor, an off-voltage is applied to the second transistor, and an on-voltage is applied to the third transistor.

8. The semiconductor storage device according to claim 1, wherein
during the write operation, at least part of a write command and an address of a next write operation is received,
the address includes a block address, and
when the block address of the write operation matches the block address of the next write operation, the control circuit omits the first voltage application operation before the write operation ends.

9. The semiconductor storage device according to claim 1, wherein
during the write operation, at least part of a write command and an address of a next write operation is received,
the address includes a block address, and
when the block address of the write operation does not match the block address of the next write operation, the control circuit performs the first voltage application operation before the write operation ends.

10. The semiconductor storage device according to claim 1, wherein
the predetermined target word line corresponds to a logic word line having a logic word line number larger than the corresponding logic word line number of a logic word line of a non-predetermined target word line in the block.

11. A semiconductor storage device comprising:
a plurality of memory strings each including a plurality of memory cell transistors connected in series, the plurality of memory strings being connected in parallel to one another;
a plurality of word lines connected to gates of the plurality of memory cell transistors;
a block including the plurality of memory strings connected to the plurality of word lines in common; and
a control circuit, wherein the plurality of word lines include a first word line and a second word line different from the first word line, the plurality of memory cell transistors include a first memory cell transistor and a second memory cell transistor, the first memory cell transistor being connected to the first word line, the second memory cell transistor being connected to the second word line, the control circuit controls a first write operation and a second write operation, the first write operation being performed on the first memory cell transistor, the second write operation being performed on the second memory cell transistor after the first write operation, the first and second write operations include a plurality of loops each including at least a program operation, a last loop in the first write operation performs the program operation and does not perform a verify operation and a first voltage application operation that applies a predetermined voltage to the first and second word lines, a last loop in the second write operation performs the program operation and the first voltage application operation, and does not perform a verify operation, wherein in a first predetermined duration that follows the first write operation and in which no command is input, the control circuit applies a ground voltage to the first and second word lines or sets the first and second word lines to floating states, in a second predetermined duration that follows the second write operation and in which no command is input, the control circuit applies the ground voltage to the first and second word lines or sets the first and second word lines to floating states, and then performs a second voltage application operation that applies a predetermined voltage to the first and second word lines, and a duration of the first predetermined duration is the same as a duration of the second predetermined duration.

12. The semiconductor storage device according to claim 11, wherein
a penultimate loop in the second write operation performs the program operation and a verify operation, and
a time period taken for the first voltage application operation is shorter than a time period taken for the verify operation.

13. The semiconductor storage device according to claim 11, wherein the second voltage application operation is executed a plurality of times in the second predetermined duration.

14. The semiconductor storage device according to claim 11, wherein when sequentially performing write operations on the plurality of memory cell transistors, the control circuit executes the first voltage application operation before the sequence of write operations ends.

15. A semiconductor storage device comprising:
a plurality of memory strings each including a plurality of memory cell transistors connected in series, the plurality of memory strings being connected in parallel to one another;
a plurality of word lines connected to gates of the plurality of memory cell transistors;
a block including the plurality of memory strings connected to the plurality of word lines in common; and
a control circuit configured to control a write operation on at least part of the plurality of memory cell transistors, wherein
the semiconductor storage device is configured to receive a control command related to a first voltage application operation, a write command and an address and perform data writing,
the write operation is executed in response to reception of the write command and the address,
the control circuit determines, in response to the control command, whether to perform the first voltage application operation before the write operation ends,
the first voltage application operation applies a predetermined voltage to the plurality of word lines, and
when the control command is received, the control circuit omits the first voltage application operation executed before the write operation ends.

16. The semiconductor storage device according to claim 15, wherein when the control command is not received, the control circuit determines, based on the address, whether to perform the first voltage application operation.

17. The semiconductor storage device according to claim 15, wherein when the control command is not received, the control circuit omits the first voltage application operation executed before the write operation ends.

* * * * *